United States Patent
Chaouch

(10) Patent No.: US 10,003,173 B2
(45) Date of Patent: Jun. 19, 2018

(54) WIDELY TUNABLE LASER CONTROL

(71) Applicant: Skorpios Technologies, Inc., Albuquerque, NM (US)

(72) Inventor: Hacene Chaouch, Albuquerque, NM (US)

(73) Assignee: Skorpios Technologies, Inc., Albuquerque, NM (US)

( * ) Notice: Subject to any disclaimer, the term of this patent is extended or adjusted under 35 U.S.C. 154(b) by 0 days. days.

(21) Appl. No.: 14/694,894

(22) Filed: Apr. 23, 2015

(65) Prior Publication Data

US 2015/0311672 A1 Oct. 29, 2015

Related U.S. Application Data

(60) Provisional application No. 61/983,337, filed on Apr. 23, 2014.

(51) Int. Cl.
*H01S 5/0687* (2006.01)
*H01S 5/06* (2006.01)
(Continued)

(52) U.S. Cl.
CPC ............ *H01S 5/0612* (2013.01); *H01S 5/021* (2013.01); *H01S 5/0687* (2013.01); *H01S 5/06256* (2013.01); *H01S 5/0261* (2013.01); *H01S 5/1007* (2013.01); *H01S 5/3013* (2013.01); *H01S 2301/163* (2013.01)

(58) Field of Classification Search
CPC ... H01S 5/0612; H01S 5/0687; H01S 5/06255
See application file for complete search history.

(56) References Cited

U.S. PATENT DOCUMENTS 4,293,826 A 10/1981 Scifres et al.
5,190,883 A 3/1993 Menigaux et al.
(Continued)

FOREIGN PATENT DOCUMENTS

EP 1507166 A1 2/2005
EP 2489106 A1 8/2012
(Continued)

OTHER PUBLICATIONS

ISR/WO dated May 29, 2015 for International Patent Application No. PCT/US2015/019482 filed on Mar. 9, 2015; all pages.
(Continued)

*Primary Examiner* — Tod T Van Roy
(74) *Attorney, Agent, or Firm* — Kilpatrick Townsend & Stockton LLP

(57) ABSTRACT

A tunable laser has a first binary super grating (BSG), a second BSG, and a phase adjuster. The first BSG, the second BSG, and the phase adjuster are optically tuned by changing temperatures of respective heating elements. The tunable laser also includes three temperature sensors, a first sensor to measure the temperature of the first BSG; a second sensor to measure the temperature of the second BSG, and a third sensor to measure the temperature of the phase adjuster. A lasing frequency is determined by a set of values of the three temperature sensors. In some embodiments, instead of a third temperature sensor, a pilot tone is applied to the phase adjuster to lock to a maximum of an aligned pair of peaks.

20 Claims, 15 Drawing Sheets

(51) Int. Cl.
*H01S 5/02* (2006.01)
*H01S 5/0625* (2006.01)
*H01S 5/30* (2006.01)
*H01S 5/026* (2006.01)
*H01S 5/10* (2006.01)

(56) References Cited

U.S. PATENT DOCUMENTS

| | | | |
|---|---|---|---|
| 5,319,667 A | 6/1994 | Dutting et al. | |
| 5,333,219 A | 7/1994 | Kuznetsov | |
| 5,454,058 A | 9/1995 | Mace et al. | |
| 5,757,986 A | 5/1998 | Crampton et al. | |
| 5,858,814 A | 1/1999 | Goossen et al. | |
| 5,981,400 A | 11/1999 | Lo | |
| 5,987,050 A | 11/1999 | Doerr et al. | |
| 6,101,210 A | 8/2000 | Bestwick et al. | |
| 6,192,058 B1 | 2/2001 | Abeles | |
| 6,667,998 B1* | 12/2003 | Lo | H01S 5/02415 372/34 |
| 6,714,566 B1 | 3/2004 | Coldren et al. | |
| 6,728,279 B1 | 4/2004 | Sarlet et al. | |
| 7,058,096 B2 | 6/2006 | Sarlet et al. | |
| 7,257,283 B1 | 8/2007 | Lie et al. | |
| 7,633,988 B2 | 12/2009 | Fish et al. | |
| 7,701,985 B2 | 4/2010 | Webster et al. | |
| 7,972,875 B2 | 7/2011 | Rogers et al. | |
| 8,106,379 B2 | 1/2012 | Bowers | |
| 8,222,084 B2 | 7/2012 | Dallesasse et al. | |
| 8,290,014 B2 | 10/2012 | Junesand et al. | |
| 8,368,995 B2 | 2/2013 | Dallesasse et al. | |
| 8,445,326 B2 | 5/2013 | Dallesasse et al. | |
| 8,559,470 B2 | 10/2013 | Dallesasse et al. | |
| 8,605,766 B2 | 12/2013 | Dallesasse et al. | |
| 8,615,025 B2 | 12/2013 | Dallesasse et al. | |
| 8,867,578 B2 | 10/2014 | Dallesasse et al. | |
| 2002/0146047 A1 | 10/2002 | Bendett | |
| 2002/0197013 A1 | 12/2002 | Liu et al. | |
| 2003/0035446 A1 | 2/2003 | Griffel | |
| 2003/0042494 A1 | 3/2003 | Worley | |
| 2003/0128724 A1 | 7/2003 | Morthier | |
| 2003/0161370 A1* | 8/2003 | Buimovich | H01S 5/06255 372/50.1 |
| 2004/0013339 A1 | 1/2004 | Arakawa | |
| 2004/0037342 A1 | 2/2004 | Blauvelt et al. | |
| 2004/0037500 A1 | 2/2004 | Yoo | |
| 2004/0066999 A1 | 4/2004 | Sakamoto et al. | |
| 2004/0077135 A1 | 4/2004 | Fan et al. | |
| 2004/0114872 A1 | 6/2004 | Nagai | |
| 2004/0174915 A1* | 9/2004 | Sarlet | H01S 5/0014 372/20 |
| 2004/0182914 A1 | 9/2004 | Venugopalan | |
| 2004/0228384 A1 | 11/2004 | Oh et al. | |
| 2004/0245425 A1 | 12/2004 | Delpiano et al. | |
| 2004/0259279 A1 | 12/2004 | Erchak et al. | |
| 2005/0129361 A1 | 6/2005 | Kim et al. | |
| 2005/0211993 A1 | 9/2005 | Sano et al. | |
| 2005/0213618 A1 | 9/2005 | Sochava et al. | |
| 2005/0226284 A1 | 10/2005 | Tanaka et al. | |
| 2005/0249509 A1 | 11/2005 | Nagarajan et al. | |
| 2006/0002443 A1 | 1/2006 | Farber et al. | |
| 2006/0093002 A1 | 5/2006 | Park et al. | |
| 2006/0104322 A1 | 5/2006 | Park et al. | |
| 2007/0002924 A1 | 1/2007 | Hutchinson et al. | |
| 2007/0280326 A1 | 12/2007 | Piede et al. | |
| 2008/0025355 A1 | 1/2008 | Hu | |
| 2008/0232409 A1* | 9/2008 | Yamazaki | G02B 6/12004 372/20 |
| 2009/0016399 A1 | 1/2009 | Bowers | |
| 2009/0135861 A1 | 5/2009 | Webster et al. | |
| 2009/0225796 A1 | 9/2009 | Kato | |
| 2009/0263143 A1 | 10/2009 | Pelley | |
| 2009/0267173 A1 | 10/2009 | Takahashi et al. | |
| 2009/0278233 A1 | 11/2009 | Pinnington et al. | |
| 2009/0294803 A1 | 12/2009 | Nuzzo et al. | |
| 2010/0111128 A1 | 5/2010 | Qin et al. | |
| 2010/0142567 A1 | 6/2010 | Ward et al. | |
| 2010/0142571 A1 | 6/2010 | Park | |
| 2011/0007761 A1 | 1/2011 | Assefa et al. | |
| 2011/0085572 A1* | 4/2011 | Dallesasse | H01S 5/021 372/20 |
| 2011/0085577 A1 | 4/2011 | Krasulick et al. | |
| 2011/0085760 A1 | 4/2011 | Han et al. | |
| 2011/0089524 A1 | 4/2011 | Nonogaki | |
| 2011/0165707 A1 | 7/2011 | Lott et al. | |
| 2011/0211604 A1 | 9/2011 | Rocsher | |
| 2011/0216997 A1 | 9/2011 | Gothoskar et al. | |
| 2011/0267676 A1 | 11/2011 | Dallesasse et al. | |
| 2012/0001166 A1 | 1/2012 | Doany et al. | |
| 2012/0002694 A1 | 1/2012 | Bowers et al. | |
| 2012/0057079 A1 | 3/2012 | Dallesasse et al. | |
| 2012/0057609 A1 | 3/2012 | Dallesasse et al. | |
| 2012/0057610 A1 | 3/2012 | Dallesasse et al. | |
| 2012/0057816 A1 | 3/2012 | Krasulick et al. | |
| 2012/0120978 A1 | 5/2012 | Budd et al. | |
| 2012/0170931 A1 | 7/2012 | Evans et al. | |
| 2012/0189317 A1 | 7/2012 | Heck et al. | |
| 2012/0224813 A1 | 9/2012 | Chen et al. | |
| 2012/0264256 A1 | 10/2012 | Dallesasse et al. | |
| 2012/0320939 A1 | 12/2012 | Baets et al. | |
| 2013/0022312 A1 | 1/2013 | Taillaert et al. | |
| 2013/0037905 A1 | 2/2013 | Shubin et al. | |
| 2013/0235890 A1 | 9/2013 | Creazzo et al. | |
| 2015/0109661 A1 | 4/2015 | Li | |

FOREIGN PATENT DOCUMENTS

| | | |
|---|---|---|
| JP | 2000/089054 A | 3/2000 |
| JP | 2003/172835 A | 6/2003 |
| JP | 2004/157192 A | 6/2004 |
| JP | 2005/045048 A | 2/2005 |
| JP | 2006/269543 A | 10/2006 |
| JP | 2007/525691 A | 6/2007 |
| JP | 2009/244868 A | 10/2009 |
| JP | 2013/507792 A | 4/2013 |
| TW | 543143 B | 7/2003 |
| TW | 2008/45520 A | 11/2008 |
| TW | 2011/40975 A | 11/2011 |
| WO | 2011/046898 A1 | 4/2011 |
| WO | 2014/025824 A2 | 2/2014 |

OTHER PUBLICATIONS

"Evanescent Waveguide Couplers" Lumberical Knowledge Base. Web. Mar. 6, 2015. <http://docs.lumerical.com/en/index.html?pic_passive_waveguide_couplers_evanescent.html>.

U.S. Non-Final Office Action dated Mar. 13, 2012 for U.S. Appl. No. 13/040,179, filed Mar. 3, 2011; 14 pages.

U.S. Final Office Action dated Aug. 13, 2012 for U.S. Appl. No. 13/040,179, filed Mar. 3, 2011; 20 pages.

U.S. Non-Final Office Action dated Dec. 12, 2012 for U.S. Appl. No. 13/040,179, filed Mar. 3, 2011; 17 pages.

Non-Final Office Action dated Feb. 6, 2015 for U.S. Appl. No. 14/135,006, filed Dec. 19, 2013; all pages.

Japanese Office Action dated Jul. 21, 2015 for Japanese Application No. 2012-534275 filed on Oct. 12, 2010; all pages.

Taiwan R.O.C. Office Action dated Nov. 18, 2015 for Taiwan R.O.C. Publication No. 201140975 filed on Oct. 13, 2010; all pages.

ISR/WO dated Jan. 22, 2015 for International Patent Application No. PCT/US2014/059900 filed on Oct. 9, 2014; all pages.

Analui et al., "A Fully integrated 20-Gb/s Optoelectronic Transceiver Implemented in a Standard 0.13-mu-m CMOS SOI Technology"; IEEE Journal of Solid State Circuits; vol. 41, No. 12; Dec. 2006; [Retrieved on Jan. 6, 2014. Retrieved from the Internet <http://ieeexplore.ieee.org/xpls/abs_all.jsp?arnumber=4014595&tag=1>; all pages.

Coldren et al.; "Tunable Semiconductor Lasers: A Tutorial"; Journal of Lightwave Technology; Jan. 2004; vol. 22, No. 1; pp. 193-202.

Coldren; "Monolithic Tunable Diode Lasers"; IEEE Journal on Selected Topics in Quantum Electronics; Nov./Dec. 2000; vol. 6, No. 6; pp. 988-999.

(56) References Cited

OTHER PUBLICATIONS

Hildebrand, et al.; "The Y-Laser: A Multifunctional Device for Optical Communication Systems and Switching Networks"; Journal of Lightwave Technology, Dec. 1993; vol. 11, No. 12; pp. 2066-2075.
Isaksson et al.; "10 Gb/s Direct Modulation of 40 nm Tunable Modulated-Grating Y-Branch Laser"; in Optical Fiber Communication Conference and Exposition and the National Fiber Optic Engineers Conference; Technical Digest (CD) (Optical Society of America, 2005), paper OTuE2; all pages.
Kuznetsov et al.; "Asymmetric Y-Branch Tunable Semiconductor Laser with 1.0 THz Tuning Range"; IEEE Photonics Technology Letters, Oct. 1992; vol. 4, No. 10; pp. 1093-1095.
Laroy et al.; "Characteristics of the New Modulated Grating Y laser (MG-Y) for Future WDM Networks"; Proceedings Symposium IEEE/LEOS Benelux Chapter; 2003; Enschede; pp. 55-58, retrieved from the Internet: <http://leosbenelux.org/symp03/s03p055.pdf>.
Laroy; "New Concepts of Wavelength Tunable Laser Diodes for Future Telecom Networks"; [dissertation] Universiteit Gent, 2006 [in Dutch and English]; 162 pages.
Laroy; "New Widely Tunable Laser Concepts for Future Telecommunication Networks"; FTW-symposium, Belgium; 2002; retrieved from the Internet: <http://photonics.intec.ugent.be/download/pub 1625.pdf>; 2 pages.
Magno et al.; "Multiphysics Investigation of Thermo-optic Effect in Silicon-on-Insulator Waveguide Arrays"; Excerpt from the Proceedings of the COM SOL Users Conference 2006; retrieved from the Internet: <http:/lcds.comsol.com/access/dl/papers/1628/Magno.pdf>; 6 pages total.
Morthier et al.; "New Widely Tunable Edge-Emitting Laser Diodes at 1.55 1-1m Developed in the European 1ST-project Newton"; Semiconductor and Organic Optoelectronic Materials and Devices; Edited by Zah, Chung-En; Luo, Yi; Tsuji, Shinji. Proceedings of the SPIE, 2005; 5624:1-8; retrieved from the Internet: <http://photonics.intec.ugent.be/download/pub1800.pdf>.
Morthier; "Advanced Widely Tunable Edge-Emitting Laser Diodes and Their Application in Optical Communications"; [presentation]; Ghent University—IMEC; 2000; 23 pages total; Can be retrieved from the Internet: <broadband02.ici.ro/program/morthier3a.ppt>.
Morthier; "New Widely Tunable Lasers for Optical Networks;" NEWTON Project No. IST-2000-28244; Dec. 2001; retrieved from the Internet: <http://www.istoptimist.unibo.iUpdf/network!projectspublic/NEWTON/Deliverables/D01.pdf>; 5 pages total.
Passaro, et al.; "Investigation of Thermo-Optic Effect and Multi reflector Tunable Filter/Multiplexer in SOI Waveguides"; Optics Express, May 2, 2005; vol. 13, No. 9; pp. 3429-3437.
Wesstrom, et al.; "Design of a Widely Tunable Modulated Grating Y-branch Laser Using the Additive Vernier Effect for Improved Super-Mode Selection"; IEEE 18th International Semiconductor Laser Conference; 2002, pp. 99-100; retrieved from the Internet: <http://photonics.intec.ugent.be/download/pub1603.pdf>.
Wesstrom, et al.; "State-of-the-Art Performance of Widely Tunable Modulated Grating Y Branch Lasers"; Optical Fiber Communication Conference, Technical Digest (CD) (Optical Society of America, 2004), paper TuE2; all pages.
ISR/WO dated Feb. 15, 2011 for PCT Application No. PCT/US2010/052249 filed on Oct. 12, 2010; all pages.
Non-final Office Action for U.S. Appl. No. 12/903,025 dated Dec. 29, 2011; all pages.
Non-Final office Action for U.S. Appl. No. 13/040,154 dated Jan. 31, 2012; all pages.
Non-Final Office Action for U.S. Appl. No. 13/040,179 dated Mar. 13, 2012; all pages.
Notice of Allowance for U.S. Appl. No. 13/112,142 dated Mar. 20, 2012; all pages.
Final Office Action for U.S. Appl. No. 12/903,025 dated May 16, 2012; all pages.
Final Office Action for U.S. Appl. No. 13/040,154 dated May 16, 2012; all pages.
Restriction Requirement for U.S. Appl. No. 12/902,621 dated May 17, 2012; all pages.
Non-Final Office Action for U.S. Appl. No. 13/040,181 dated May 22, 2012; all pages.
Final Office Action for U.S. Appl. No. 13/040,179 dated Aug. 13, 2012; all pages.
Non-Final Office Action for U.S. Appl. No. 13/527,394 dated Aug. 31, 2012; all pages.
Non-Final Office Action for U.S. Appl. No. 12/902,621 dated Sep. 18, 2012; all pages.
Notice of Allowance for U.S. Appl. No. 13/076,205 dated Sep. 19, 2012; all pages.
Non-Final Office Action for U.S. Appl. No. 13/040,154 dated Dec. 4, 2012; all pages.
Non-Final Office Action for U.S. Appl. No. 12/903,025 dated Dec. 5, 2012; all pages.
Final Office Action for U.S. Appl. No. 13/040,181 dated Dec. 5, 2012; all pages.
Non-Final Office Action for U.S. Appl. No. 13/040,179 dated Dec. 12, 2012; all pages.
Restriction Requirement for U.S. Appl. No. 13/040,184 dated Dec. 21, 2012; all pages.
Notice of Allowance for U.S. Appl. No. 13/527,394 dated Jan. 29, 2013; all pages.
Non-Final Office Action for U.S. Appl. No. 12/902,621 dated Apr. 23, 2013; all pages.
Non-Final Office Action for U.S. Appl. No. 13/040,184 dated Apr. 23, 2013; all pages.
Final Office Action for U.S. Appl. No. 12/903,025 dated May 29, 2013; all pages.
Notice of Allowance for U.S. Appl. No. 13/040,179 dated Jun. 12, 2013; all pages.
Final Office Action for U.S. Appl. No. 13/040,154 dated Jun. 17, 2013; all pages.
Notice of Allowance for U.S. Appl. No. 13/040,154 dated Jul. 26, 2013; all pages.
Notice of Allowance for U.S. Appl. No. 12/903,025 dated Aug. 8, 2013; all pages.
Non-Final Office Action for U.S. Appl. No. 13/869,408 dated Aug. 30, 2013; all pages.
Notice of Allowance for U.S. Appl. No. 12/902,621 dated Oct. 2, 2013; all pages.
Notice of Allowance for U.S. Appl. No. 13/040,184 dated Oct. 4, 2013; all pages.
Notification of Transmittal of the International Search Report and the Written Opinion of the International Searching Authority, or the Declaration; International Search Report and the Written Opinion of the International Searching Authority for International Application No. PCT/US2013/053856 dated Jan. 29, 2014; all pages.
Japanese Office Action dated Oct. 7, 2014 for Patent Application No. 2012-534275 filed on Oct. 12, 2010; all pages.
Final Office Action dated Nov. 6, 2015 for U.S. Appl. No. 14/488,041, filed Sep. 16, 2014; all pages.

\* cited by examiner

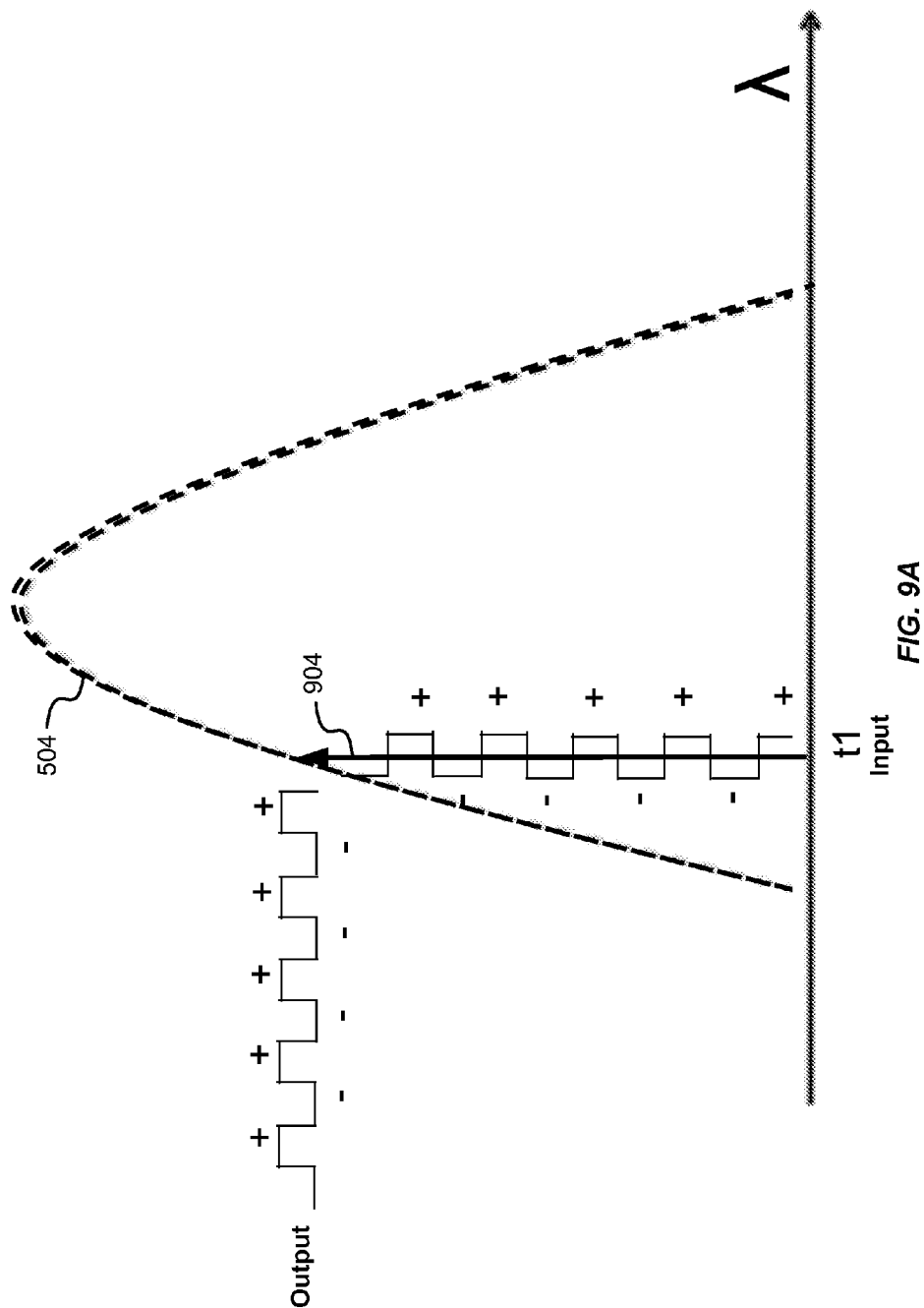

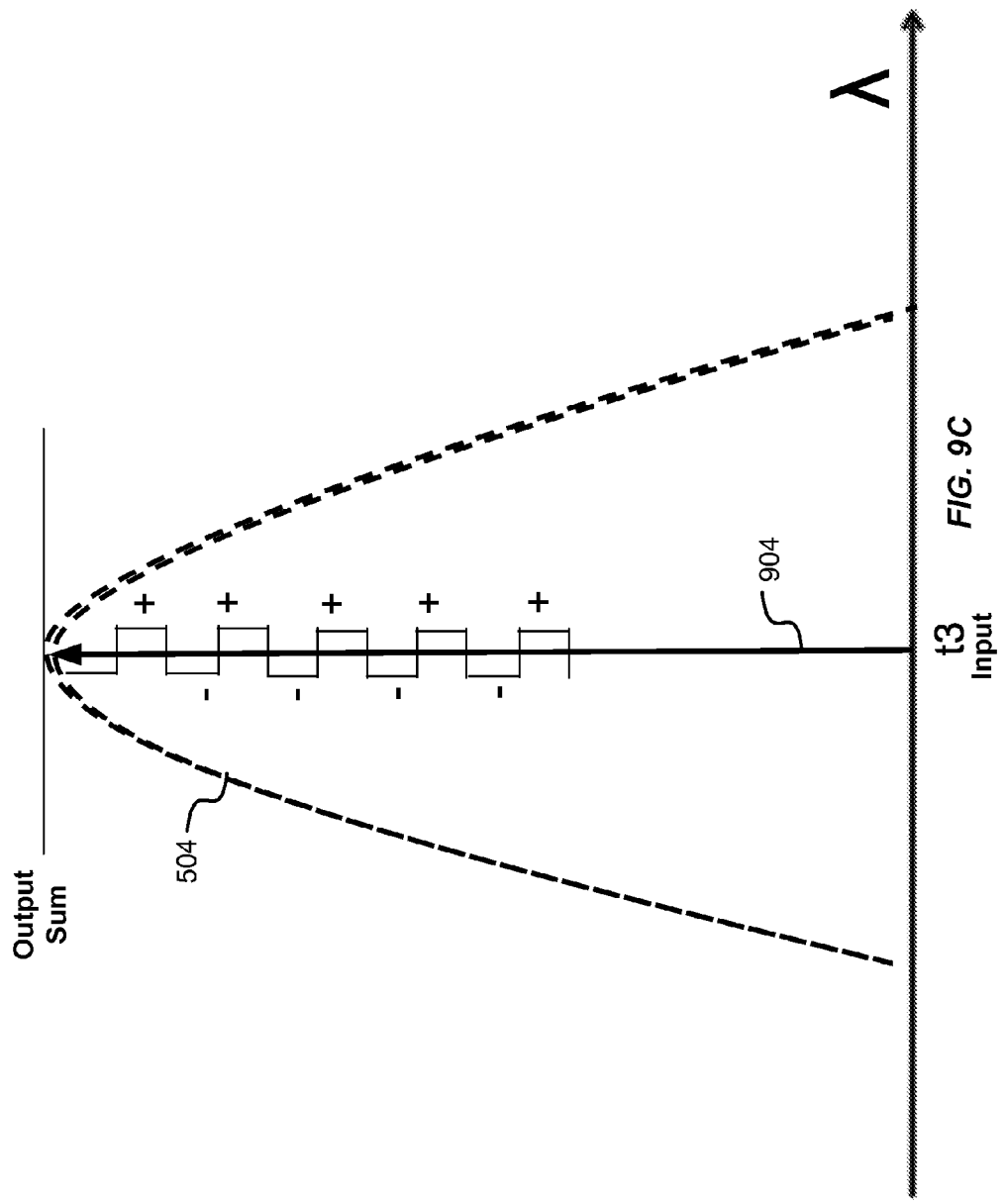

WIDELY TUNABLE LASER CONTROL

CROSS-REFERENCES TO RELATED APPLICATIONS

This application claims priority to U.S. Provisional Application No. 61/983,337, filed on Apr. 23, 2014, the disclosure of which is incorporated by reference in its entirety for all purposes. This application is related to U.S. application Ser. No. 14/642,415, filed on Mar. 9, 2015, and U.S. application Ser. No. 14/642,443, filed on Mar. 9, 2015, which are incorporated by reference for all purposes.

BACKGROUND

This application relates to tunable lasers. More specifically, and without limitation, to tunable semiconductor lasers using binary super gratings (BSGs). Silicon integrated circuits ("ICs") have dominated the development of electronics and many technologies based upon silicon processing have been developed over the years. Their continued refinement led to nano-scale feature sizes that can be important for making metal oxide semiconductor CMOS circuits. On the other hand, silicon is not a direct-bandgap material. Although direct-bandgap materials, including III-V compound semiconductor materials, have been developed, there is a need in the art for improved methods and systems related to photonic ICs utilizing silicon substrates.

BRIEF SUMMARY

In some embodiments, systems and methods for mapping values from temperature sensors to lasing frequencies are disclosed. The mapped values from temperature sensors are used to align a tunable laser to different frequencies without a need for a wavelength locker.

In some embodiments, a pilot tone is applied to a phase adjuster of a laser cavity to align a longitudinal mode of the laser cavity with aligned reflectance peaks of gratings.

In some embodiments, a tunable laser system comprises a first wavelength selective element (e.g., binary super grating); a second wavelength selective element; a phase adjuster; a gain medium; a first temperature sensor; a second temperature sensor; a third temperature sensor. The first wavelength selective element is characterized by a first reflectance spectrum, wherein the first reflectance spectrum is a function of temperature of a first heating element. The second wavelength selective element is characterized by a second reflectance spectrum, wherein: the second reflectance spectrum is a function of temperature of a second heating element; and the first wavelength selective element and the second wavelength selective element form an optical resonator. The phase adjuster is for modifying an index of refraction of a material to alter an optical path length of the optical resonator by changing a temperature of the material using a third heating element, wherein the index of refraction of the material is a function of temperature. The gain medium is disposed between the first wavelength selective element and the second wavelength selective element. The first temperature sensor is configured to determine changes in temperature of the first heating element. The second temperature sensor is configured to determine changes in temperature of the second heating element. The third temperature sensor is configured to determine changes in temperature of the third heating element, wherein operating the tunable laser system at different lasing frequencies is based on using predetermined values of the first temperature sensor, the second temperature sensor, and the third temperature sensor.

In some embodiments: The first wavelength selective element is formed on a substrate; and the first temperature sensor is a diode formed on the substrate. The first wavelength selective element and the second wavelength selective element each comprise a binary super grating. The first wavelength selective element and the second wavelength selective element are made of silicon and the gain medium comprises III-V material. The tunable laser system further comprises a directional coupler disposed between the first wavelength selective element and the second wavelength selective element (e.g., in the optical resonator). The optical resonator comprises a thick-silicon waveguide (e.g., greater than 1.0 μm). The first wavelength selective element and the second wavelength selective element are formed on a silicon-on-insulator (SOI) wafer. The gain medium is disposed in a pit of the SOI wafer. And in some embodiments, the tunable laser system further comprises three proportional-integral-derivative (PID) controllers for locking the heating elements to certain values.

In some embodiments, a method for calibrating a laser comprises: thermally tuning a first wavelength selective element and second wavelength selective element, wherein: the first wavelength selective element has a first plurality of reflectance peaks; the second wavelength selective element has a second plurality of reflectance peaks; and thermally tuning the first wavelength selective element and the second wavelength selective element includes aligning a reflectance peak of the first plurality of reflectance peaks to, at least partially, overlap a reflectance peak of the second plurality of reflectance peaks to form an aligned pair of peaks, wherein the aligned pair of peaks has a reflectance at a first frequency; thermally tuning a phase section of the laser to align a longitudinal mode of the laser within the aligned pair of peaks; recording a first value, wherein: the first value is from a first temperature sensor; the first temperature sensor measures values corresponding to a temperature of a first heating element; and the first heating element is used to change temperature of the first wavelength selective element; recording a second value, wherein: the second value is from a second temperature sensor; the second temperature sensor measures values corresponding to a second heating element; and the second heating element is used to change temperature of the second wavelength selective element; and recording a third value, wherein: the third value is from a third temperature sensor; the third temperature sensor measures values corresponding to a temperature of a third heating element; the third heating element is used to change temperature of the phase section; and the first value, the second value, and the third value determine a lasing frequency of the laser.

In some embodiments: Thermally tuning the first wavelength selective element and the second wavelength selective element includes using a wavelength meter. The method further comprises aligning the aligned pair of peaks with one or more ITU (International Telecommunications Union) channels. The method further comprises moving the aligned pair of peaks to a second frequency. The method further comprises moving the aligned pair of peaks to the second frequency using extrapolated data. The laser uses a semiconductor material for a gain medium; a first injection current is used for the gain medium during the tuning of the phase section of the laser to align the longitudinal mode; and a second injection current, different from the first injection current, is used for the gain medium for a second tuning of the phase section of the laser to align the longitudinal mode. And in some embodiments, when the aligned pair of peaks is formed, other peaks of the first plurality of reflectance peaks do not substantially overlap with other peaks of the second plurality of reflectance peaks.

In some embodiments, a method for tuning a laser comprises referencing three values and tuning three heating elements each to one of the three values to obtain a predetermined lasing frequency for the laser. In some embodiments, a control-loop feedback system is used (e.g., a PID system). In some embodiments, the three values are a temperature, a current, or a voltage, and/or a mix of two or more of a temperature, a current, and a voltage. In some embodiments, the three sensors are integrated on the substrate using CMOS processing techniques (e.g., fabricating the sensors in a device layer of an SOI wafer).

Further areas of applicability of the present disclosure will become apparent from the detailed description provided hereinafter. It should be understood that the detailed description and specific examples, while indicating various embodiments, are intended for purposes of illustration only and are not intended to necessarily limit the scope of the disclosure.

BRIEF DESCRIPTION OF THE DRAWINGS

FIGS. 9A, 9B, and 9C depict drawings of embodiments of an aligned pair of peaks with a pilot tone applied to a longitudinal mode.

Figure 1:
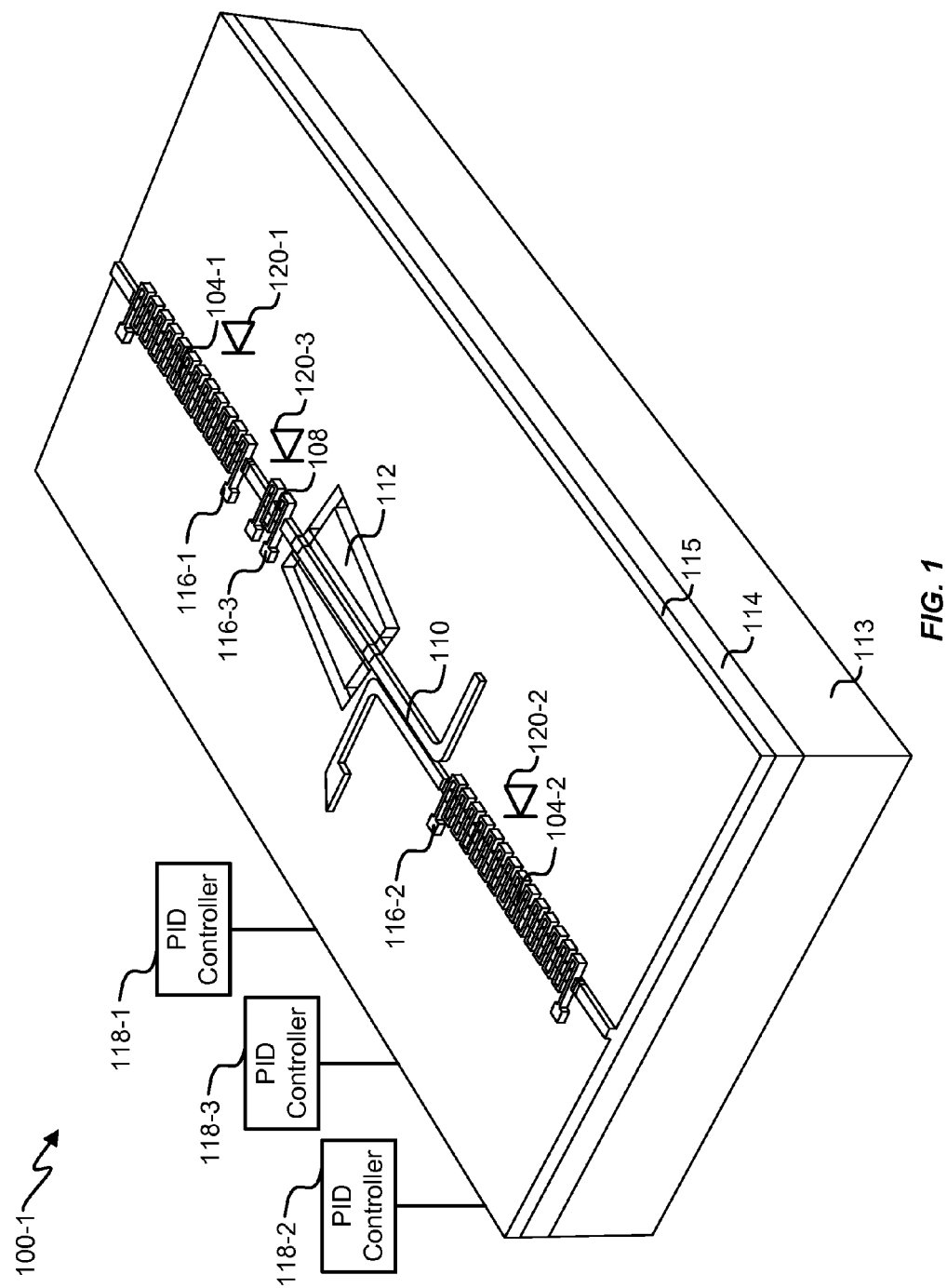
FIG. 1 depicts an embodiment of a laser having three diode temperature detectors (DTD) used for determining a lasing wavelength for the laser.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

The ensuing description provides preferred exemplary embodiment(s) only, and is not intended to limit the scope, applicability, or configuration of the disclosure. Rather, the ensuing description of the preferred exemplary embodiment(s) will provide those skilled in the art with an enabling description for implementing a preferred exemplary embodiment. It is understood that various changes may be made in the function and arrangement of elements without departing from the spirit and scope as set forth in the appended claims.

Distributed Bragg Reflector (DBR)-based semiconductor lasers have a first grating, gain section, phase section, and second grating. Binary super gratings (BSGs) using III-V compound materials are used in applications for wide tuning capabilities. Often, wavelength tuning is performed by injecting current into the BSGs III-V material. Additionally, some DBR-lasers use an external temperature controlled wavelength locker for wavelength control of a gain medium. But refractive index change of III-V materials is not linear with current injection. Therefore, it is often not practical to analytically predict current needed to lase at different, predetermined frequencies, such as at different ITU (International Telecommunications Union) channels. Thus lengthy calibration time is often needed to find current settings for 96 different ITU channels. Further, additional power consumption is needed to cool a wavelength locker, and additional circuitry is needed (e.g., digital-to-analog and analog-to-digital converters).

In some embodiments of the present invention, lasing wavelength of a tunable laser is thermally controlled. For example, BSGs made of silicon are used and overlaid with heating elements. As current in the heating elements are increased or decreased, the refractive index of the BSGs also increases or decreases. Additionally, a heating element is used to change the index of refraction of a portion of the tunable laser to align longitudinal modes of the tunable laser with reflectance peaks of the BSGs. In some embodiments, the relationship between a change in temperature and a change in index of refraction is linear, or substantially linear. Thus, for a given set of temperature settings for the heating elements, the tunable laser operates at a certain lasing frequency. A calibrated tunable laser can be operated at a predetermined frequency by setting values of the heating elements to predetermined values. Further, settings for other frequencies can more easily be predicted because the relationship between index of refraction changes and temperature changes is linear. In some embodiments, the tunable laser sits on top of a substrate that is kept at a constant temperature using a thermo-electric cooler (TEC) and a TEC controller.

Referring first to FIG. 1, an embodiment of a first tunable laser 100-1 having three diode temperature detectors used for determining a lasing wavelength for the first tunable laser 100-1 is shown. The first tunable laser 100-1 is similar to a laser with directional coupler as disclosed in U.S. patent application No. 14/642,415 filed on Mar. 9, 2015, and which is incorporated by reference. The first tunable laser 100-1 comprises a first BSG 104-1, a second BSG 104-2, a phase adjuster 108, and a gain medium 112. In some embodiments, BSGs 104 are considered wavelength selective elements. In some embodiments, the phase adjuster works over a portion of the tunable laser 100 referred to as a phase section. The first tunable laser 100-1 comprises a directional coupler 110 (e.g., as described in the '415 application). The first BSG 104-1 and the second BSG 104-2 are made of silicon (e.g., crystalline silicon). In some embodiments, elements such as the BSGs 104 and/or phase adjuster 108 are fabricated on a silicon-on-insulator (SOI) wafer, the SOI wafer comprising a substrate 113 (e.g., handle) of crystalline silicon, an insulation layer 114 (e.g., BOX made of SiO2), and a device layer 115 (e.g., crystalline silicon). The gain medium 112 comprises a different material than the first BSG 104-1 and the second BSG 104-2.

In some embodiments. The gain medium 112 is a III-V compound. In some embodiments, the gain medium is formed in a pit of an SOI wafer. A BSG 104 has a super period that defines a reflectance spectrum. A reflectance spectrum has two or more reflectance peaks, referred to as super modes. In some embodiments, a reflectance spectrum has between 3 and 12 super modes (e.g., 5, 7, 8, or 11). Cascading multiple super periods increases reflectance of the super modes of the BSG 104. In some embodiments, the first BSG 104-1 and the second BSG 104-2 have a similar number of super periods, each BSG 104 having high reflectance (e.g., one or more super modes having reflectance equal to or greater than 80%, 85%, 90%, 95%, 97%, 98%, 99%, 99.5%, 99.9% or 100%). The first BSG 104-1 and the second BSG 104-2 form a laser cavity (i.e., a laser resonator).

The first BSG 104-1, the second BSG 104-2, and the phase adjuster 108 each have a corresponding heating element (a first heating element 116-1 for the first BSG 104-1, a second heating element 116-2 for the second BSG 104-2, and a third heating element 116-3 for the phase adjuster 108). In some embodiments, the heating element 116 comprises a metal deposited on the SOI wafer using a CMOS process. Also shown is a first diode temperature detector (DTD) 120-1, a second DTD 120-2, and a third DTD 120-3. In some embodiments, the DTDs 120 are fabricated while fabricating one or more BSGs 104. The first DTD 120-1 measures a temperature that corresponds to a temperature of the first BSG 104-1. The second DTD 120-2 measures a temperature that corresponds with the second BSG 104-2. The third DTD 120-3 measures a temperature that corresponds with the phase adjuster 108.

In some embodiments, a super mode of the first BSG 104-1 and a super mode of the second BSG 104-2 are thermally aligned by adjusting the first heating element 116-1 of the first BSG 104-1 and the second heating element 116-2 of the second BSG 104-2. In some embodiments, an initial heat bias is given to the first heating element 116-1 and/or the second heating element 116-2. When a super mode of the first BSG 104-1 and a super mode of the second BSG 104-2 are aligned, an aligned pair of peaks is formed. The aligned pair of peaks is then moved to a desired first frequency (e.g., a first ITU channel) by adjusting the first heating element 116-1 of the first BSG 104-1 and the second heating element 116-2 of the second BSG 104-2 together.

When the aligned pair of peaks is formed, other super modes of the first BSG 104-1 do not substantially overlap with other super modes of the second BSG 104-2. In some embodiments, substantially overlap means a lasing mode can be supported, in addition to lasing mode(s) supported by the aligned pair of peaks. In some embodiments, substantially overlap means that a highest reflectance (measured as R1*R2, where R1 is the reflectance of the first BSG 104-1, and R2 is the reflectance of the second BSG 104-2) for a given wavelength of the overlap is greater than a threshold value (e.g., greater than 5%, 10%, 15%, 20%, 25%, 30%, 40%, or 50%).

After the aligned pair of peaks is aligned near the first frequency, the third heating element 116-3 of the phase adjuster 108 is used to align a longitudinal mode of the tunable laser 100 with the aligned pair of peaks. In some embodiments, further adjustments are made to the aligned pair of peaks (and/or the longitudinal mode) so that the aligned pair of peaks and the longitudinal mode of the tunable laser 100 are aligned with the first frequency. In some embodiments, an optical spectrum analyzer is used to measure side-mode suppression of longitudinal modes within the aligned pair of peaks during calibration.

After the first BSG 104-1, the second BSG 104-2, and a longitudinal mode (aligned by the phase adjuster 108) are aligned, a first temperature, a second temperature, and a third temperature (or voltages) are recorded to form a first set of temperatures, wherein the first temperature is a temperature measured by the first DTD 120-1 and corresponds to a temperature of the first BSG 104-1; the second temperature is a temperature measured by the second DTD 120-2 and corresponds to a temperature of the second BSG 104-2; and the third temperature is a temperature recorded by the third DTD 120-3 and corresponds to a temperature of the phase adjuster 108. For the first tunable laser 100-1 to operate at the first frequency, one or more feedback control loops (e.g., using PID controllers 118, one PID controller 118 for each heating element 116) are used to control the heating elements 116 to keep the first DTD 120-1, the second DTD 120-2, and the third DTD 120-3 locked to the first set of temperatures. For example, the first set of temperatures has three values that are used as set points for three PID controllers 118. A first PID 118-1 controller adjusts power to the first heating element 116-1 so that the first DTD 120-1 reads the first temperature (the first temperature being the set point for the first PID controller). And similarly, a second PID controller 118-2 controls the second heating element 116-2 and a third PID controller 118-3 controls the third heating element 116-3.

In some embodiments, additional sets of temperatures (with three values each) are experimentally and/or analytically determined for additional frequencies. For example, a set of temperatures for each of the 96 ITU channels are determined and stored in memory. When the tunable laser 100 is to operate at a specific ITU channel, a set of temperatures that correspond to the specific channel are used as set points for PID controllers 118. Thus, in some embodiments, a single-mode lasing frequency is determined by a set of three temperatures without a need for a wavelength locker and corresponding circuitry.

Figure 2:
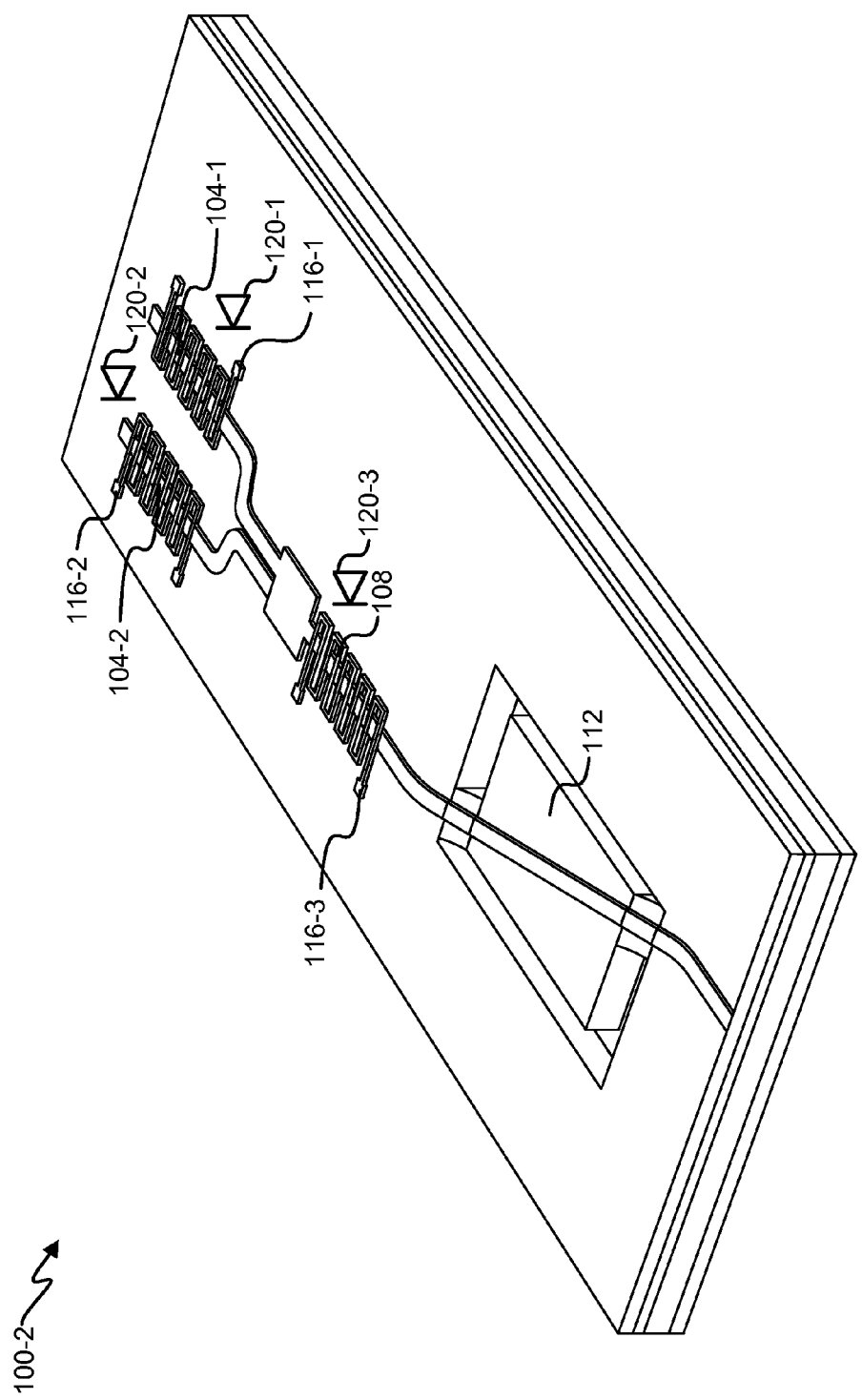
FIG. 2 depicts another embodiment of a laser having three DTD used for determining a lasing wavelength for the laser.

FIG. 2 depicts an embodiment of a second tunable laser 100-2 having three DTDs used for determining a lasing wavelength for the second tunable laser 100-2. In this embodiment, the tunable laser 100-2 is similar to a laser disclosed in U.S. Pat. No. 8,615,025, granted on Dec. 24, 2013. Similar to the three DTDs 120 shown in FIG. 1, three DTDs 120 are shown in FIG. 2. The three DTDs 120 are used to operate the tunable laser 100-2 at various frequencies based on sets of temperature readings of the three DTDs 120, as described for FIG. 1.

Figure 3:
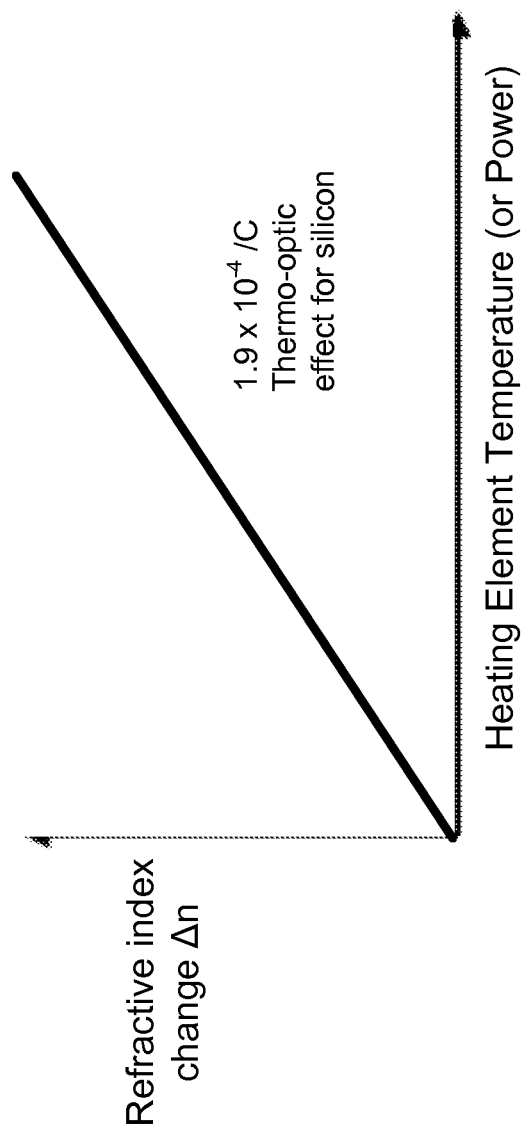
FIG. 3 shows a plot of refractive index change as a function of temperature.

FIG. 3 shows a plot of refractive index of silicon as a function of temperature. As temperature is increased, the refractive index of silicon increases linearly. With this linear relationship, it is possible to predict other lasing frequencies. Thus DTD 120 measurements for many ITU channels can be analytically predicted. Additionally, DTDs 120 provide accurate monitoring of BSG 104 and phase adjuster 108 temperature over a life of the tunable laser 100.

Figure 4:
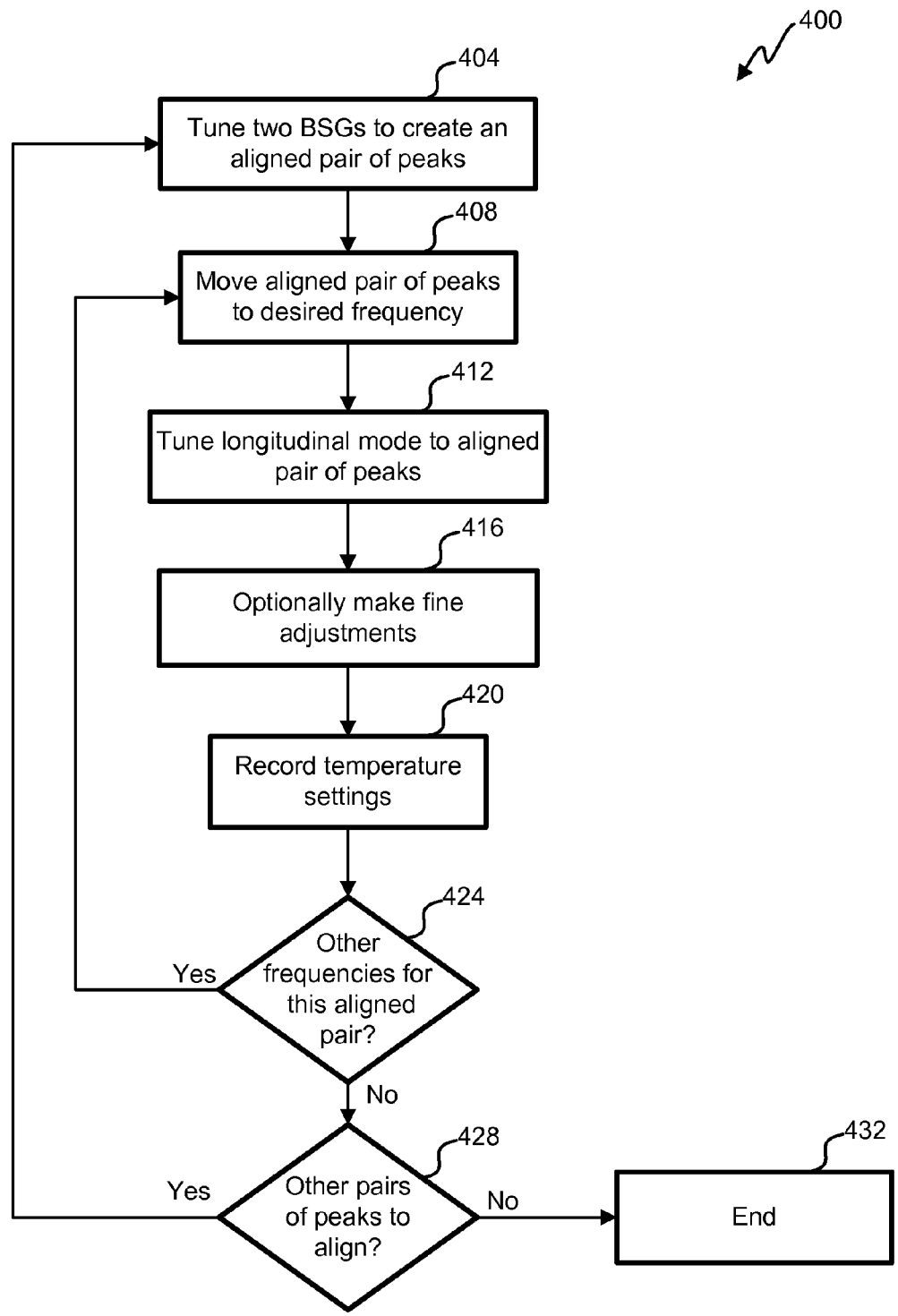
FIG. 4 illustrates a flowchart of an embodiment of a process for calibrating a laser having three DTDs.

FIG. 4 illustrates a flowchart of an embodiment of a process 400 for calibrating a laser having three DTDs 120. First, the first BSGs 104-1 and the second BSG 104-2 are independently tuned to align a desired pair of peaks, step 404. Next, the aligned pair of peaks is moved to a desired frequency by adjusting, together, the first heating element 116-1 of the first BSG 104-1 and the second heating element 116-2 the second BSG 104-2, step 408. When the pair of peaks is aligned to the desired frequency, the third heating element 116-3 of the phase adjuster 108 is used to align a longitudinal cavity mode to the desired frequency, step 412. In some embodiments, aligning the longitudinal cavity mode to the desired frequency is performed using feedback from a wavelength meter. In some embodiments, optional fine adjustments are made, step 416. For example, injection current to the gain medium can be adjusted. Additionally, fine tuning the first BSG 104-1, the second BSG 104-2, and/or the phase adjuster 108 to maximize side mode suppression using an optical spectrum analyzer can be performed. Further, re-adjusting lasing frequency using a wavelength meter can be performed. In step 420, a set of temperatures is recorded to be used later when operating the laser.

In step 424 a decision is made whether or not there are other frequencies to align a given aligned pair of peaks to. If so, the process returns to step 408; if not, the process proceeds to step 428. In step 428 a decision is made whether or not a new aligned pair of peaks should be made. If so, the process returns to step 404; if not, the calibration process ends, step 432. In some embodiments, injection current is also changed during calibration. In some embodiments, having measurements with different injection currents allows extrapolation for temperature values while operating the tunable laser 100 at different power levels (e.g., changing power levels for different applications and/or compensating for lower lasing power as the laser ages).

Figure 5A:
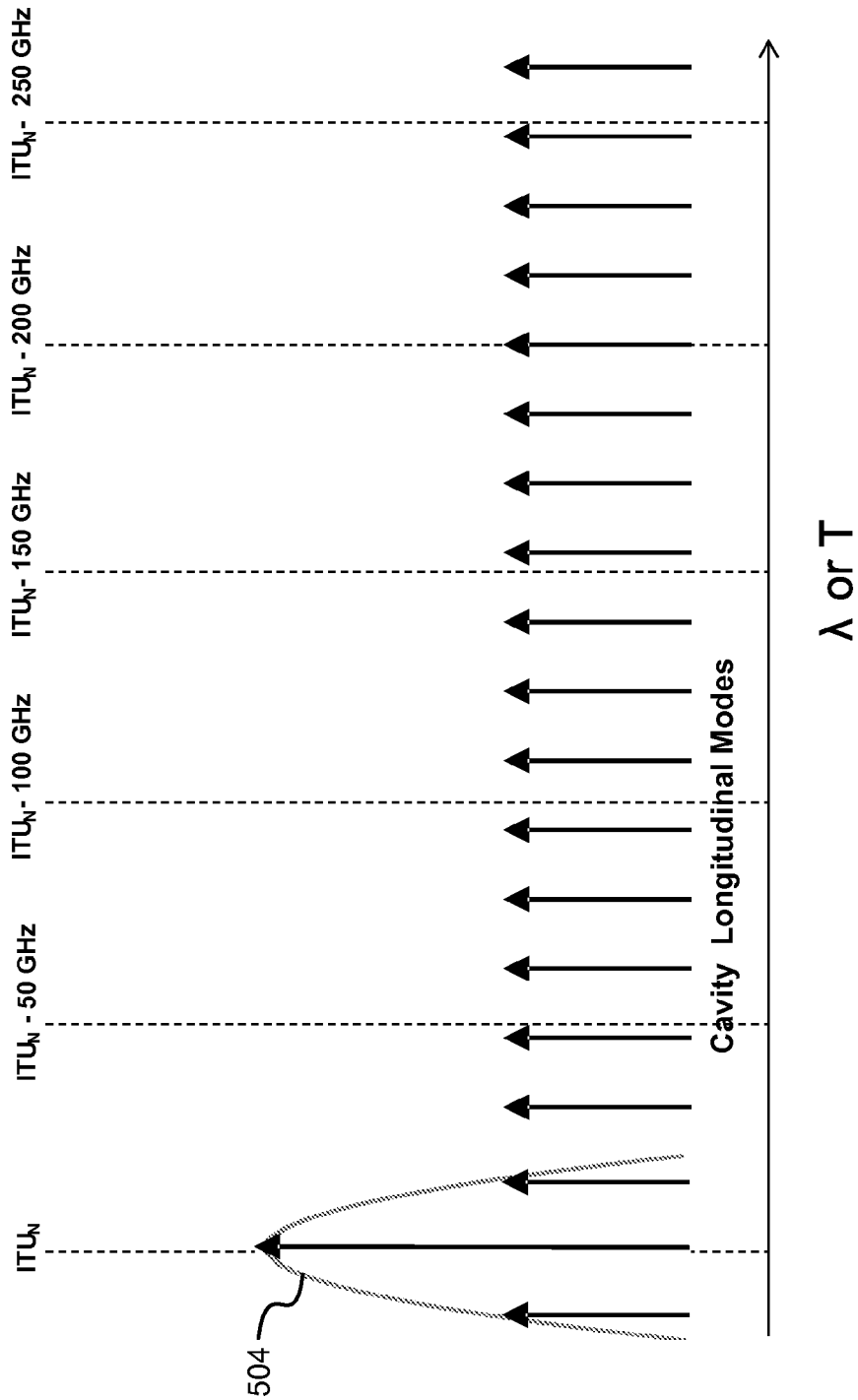
FIGS. 5A, 5B, and 5C illustrate an embodiment of using a phase adjuster to align longitudinal modes of a resonant cavity with reflectance peaks of binary super gratings (BSGs) for operating a tunable laser at different ITU (International Telecommunications Union) channels.
Figure 5B:
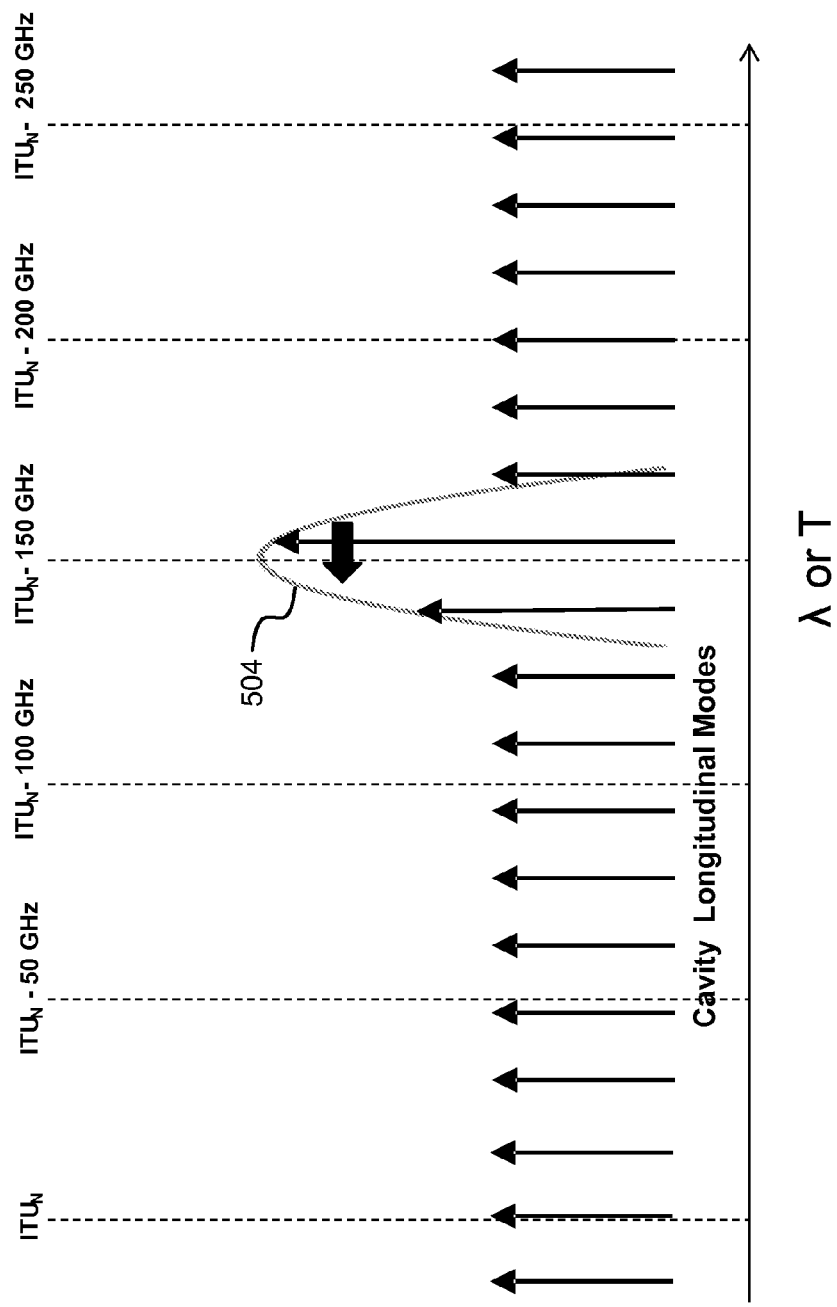
Figure 5C:
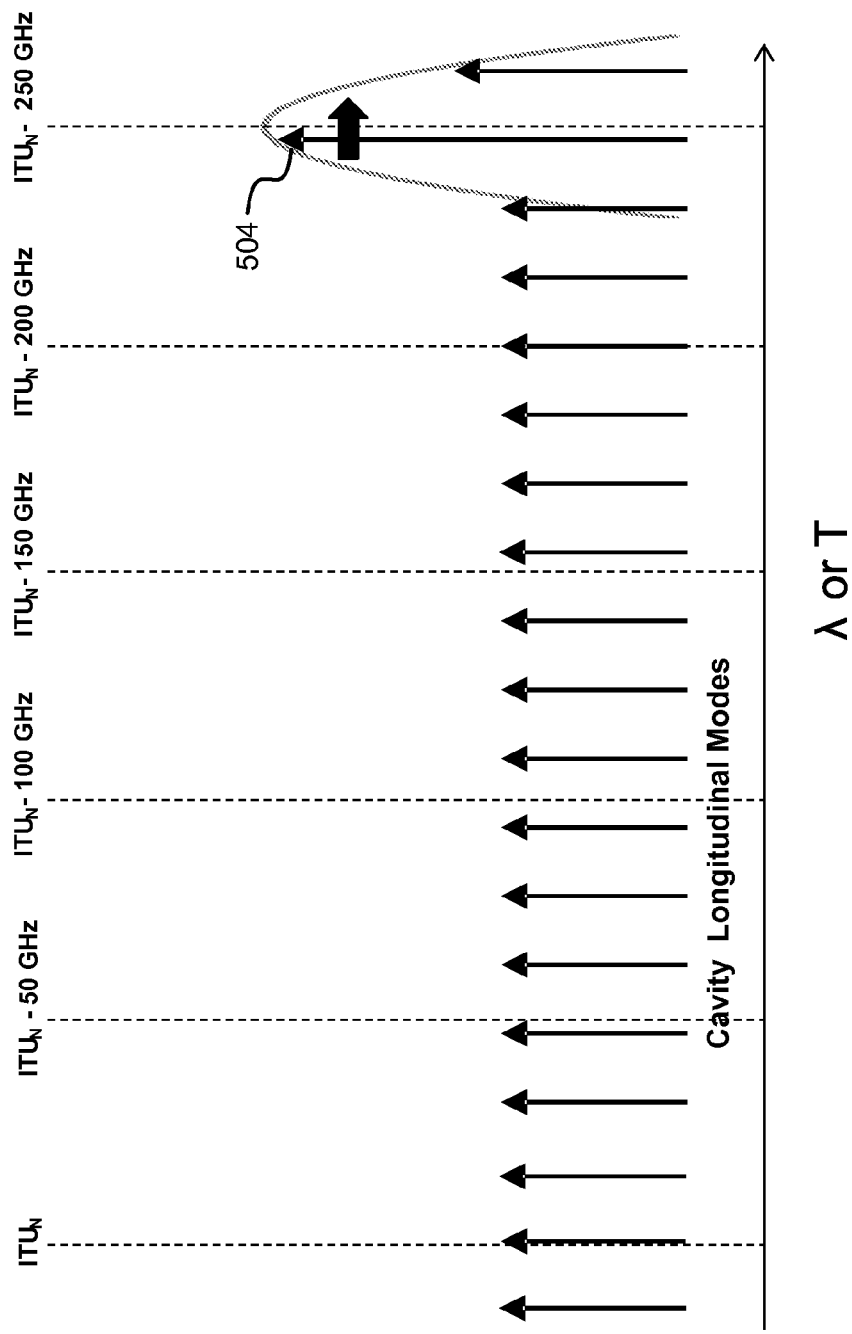

FIGS. 5A, 5B, and 5C illustrate an embodiment of using a phase adjuster 108 to align longitudinal modes of a resonant cavity with reflectance peaks of binary super gratings (BSGs) 104 for operating the tunable laser 100 at different ITU channels. In FIG. 5A, an aligned pair of peaks 504 is centered at or near a first ITU channel, $ITU_N$ (e.g., by step 408 in FIG. 4). Temperature of the phase adjuster 108 is then increased or decreased to align a longitudinal mode of the resonant cavity with the aligned pair of peaks 504 (e.g., step 412 in FIG. 4). The temperature of the phase adjuster 108 (e.g., using the third DTD 120-3) is then recorded, along with temperatures of the first BSG 104-1 and the second BSG 104-2 (e.g., using the first DTD 120-1 and the second DTD 120-2, respectively). In FIG. 5B, the aligned pair of peaks 504 is moved to a second ITU channel, $ITU_N$-150 GHz (e.g., step 408 in FIG. 4). In the example in FIG. 5B, the longitudinal mode nearest the center of the aligned pair of peaks has a wavelength that is longer than the peak of the aligned pair of peaks. Thus the temperature of the phase adjuster 108 is reduced to align the longitudinal mode with the aligned pair of peaks 504 (e.g., step 412 in FIG. 4). The temperature of the phase adjuster 108 is then recorded, along with temperatures of the first DTD 120-1 and the second DTD 120-2. In FIG. 5C, the aligned pair of peaks 504 is moved to a third ITU channel, $ITU_N$-250 GHz (e.g., step 408 in FIG. 4). In the example in FIG. 5C, the longitudinal mode nearest the center of the aligned pair of peaks has a wavelength shorter than the aligned pair of peaks 504. Thus the temperature of the phase adjuster 108 is increased to align the longitudinal mode with the aligned pair of peaks 504 (e.g., step 412 in FIG. 4). The temperature of the phase adjuster 108 is then recorded, along with temperatures of the first BSG 104-1 and the second BSG 104-2.

Figure 6:
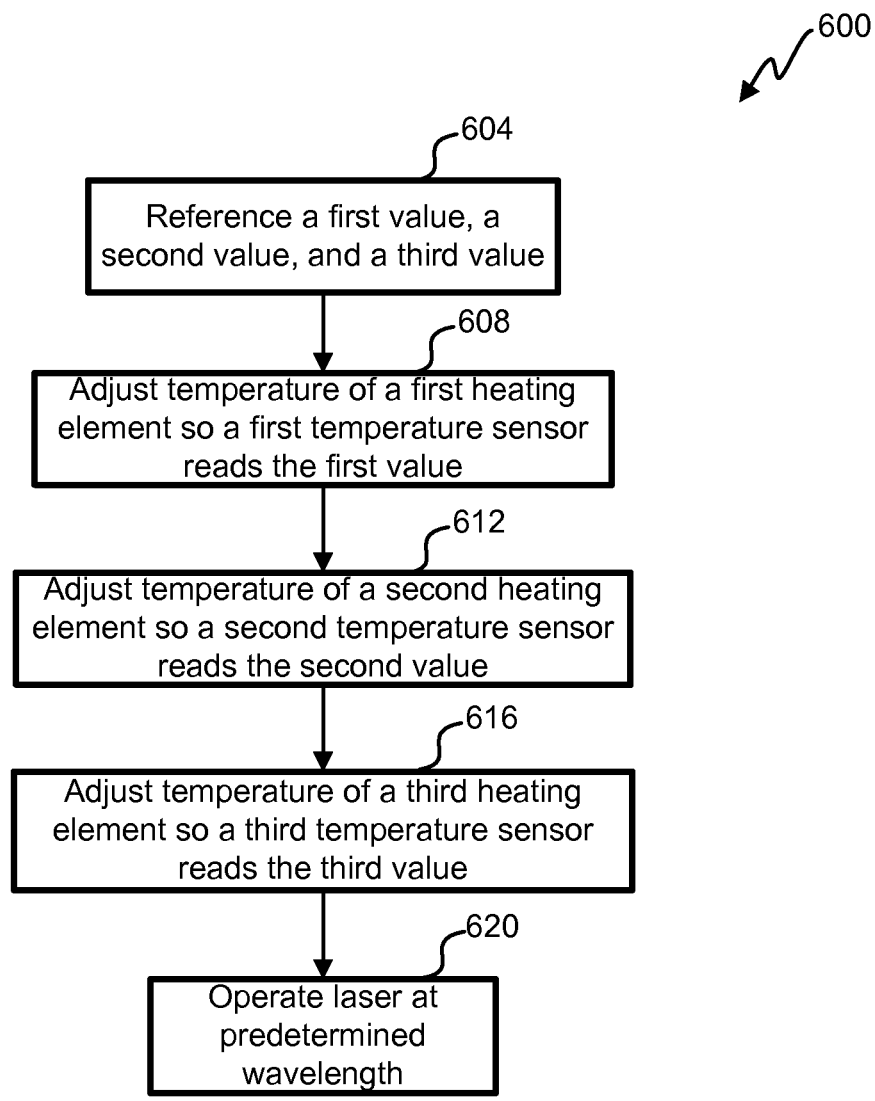
FIG. 6 illustrates a flowchart of an embodiment of a process for operating a laser at a predetermined frequency using three DTDs.

FIG. 6 illustrates a flowchart of an embodiment of a process 600 for operating the tunable laser 100 at a predetermined frequency by using three DTDs 120. The process begins in step 604 where a first value, a second value, and a third value are referenced. In some embodiments, the first value, the second value, and the third value were obtained by calibrating the tunable laser 100 to a particular ITU channel as discussed with reference to FIGS. 4 and 5. In some embodiments, the first value, the second value, and the third value are voltages for DTDs 120 that correspond to temperatures. It is to be understood that even though this application discusses measuring temperatures using diodes, measuring a voltage across a diode is equivalent to measuring temperature. Thus when this application discusses measuring a temperature, measuring a voltage or current are also ways to "measure" a temperature.

In step 608, the temperature of the first heating element 116-1, which corresponds to the first BSG 104-1, is adjusted so that the first DTD 120-1 has a measurement that equals, or is within a threshold error tolerance of, the first value. In step 612, the temperature of the second heating element 116-2, which corresponds to the second BSG 104-2, is adjusted so that the second DTD 120-2 has a measurement that equals, or is within a threshold error tolerance of, the second value. In step 616, the temperature of the third heating element 116-3, which corresponds to the phase adjuster 108, is adjusted so that the third DTD 120-3 has a measurement that equals, or is within a threshold error tolerance of, the third value. In some embodiments, the following expression summarizes steps 608, 612, and 616:

$$(DTD_1, DTD_2, DTD_3)_{Reading,t} - (DTD_1, DTD_2, DTD_3)_{Target} \rightarrow 0$$

In some embodiments, wavelength locking is performed using closed PID loops on DTD 120 target values found during calibration. Though not meant to be limiting, DTD 120 reading accuracy is estimated to be <20 MHz, allowing high precision wavelength accuracy over operation life of the laser.

In some embodiments, not all three DTDs 120 are used. For example, in one embodiment the first BSG 104-1 and the second BSG 104-2 are controlled by current injection instead of by temperature. Thus only one DTD 120 is used (for the phase adjuster).

Figure 7:
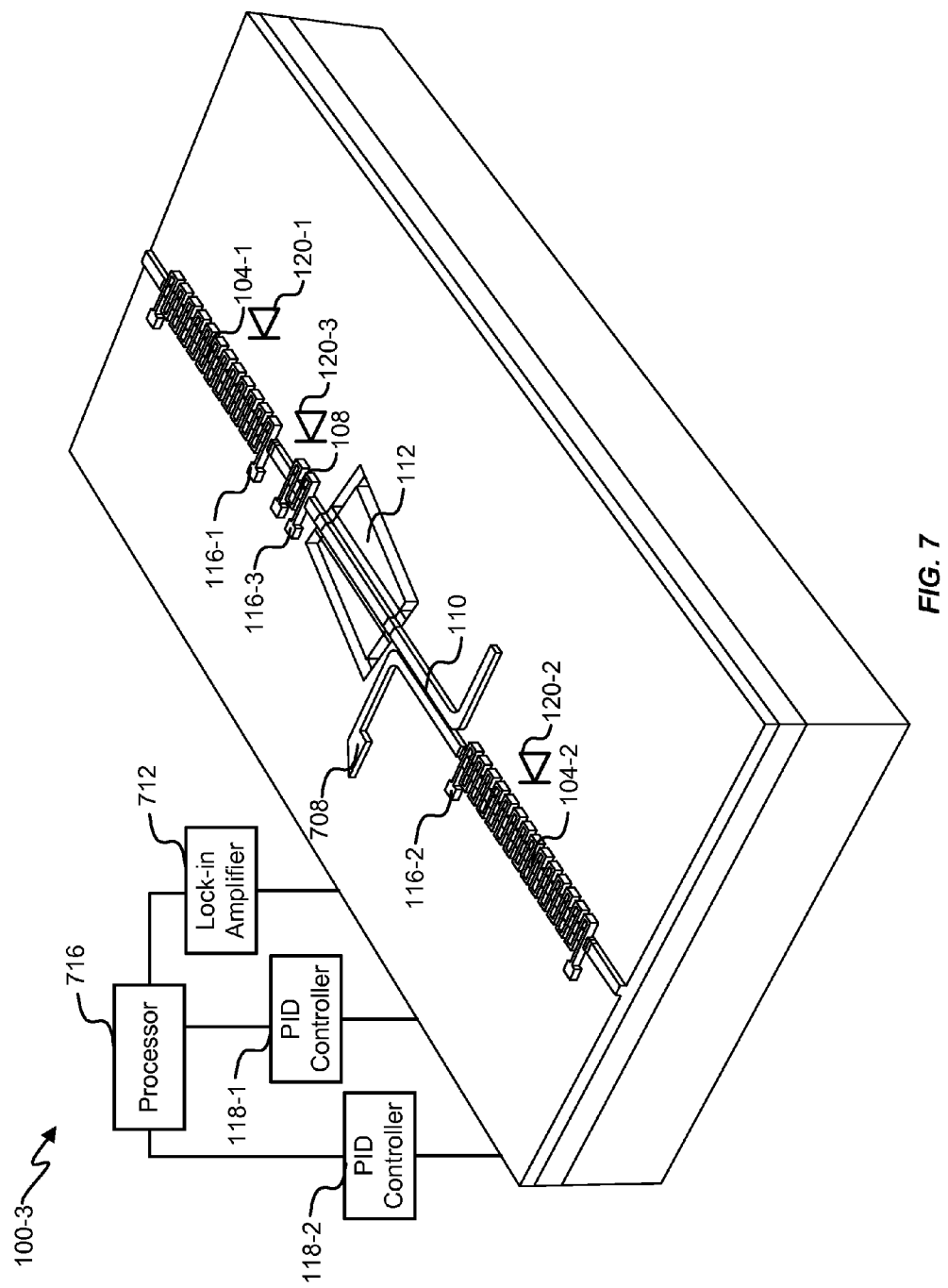
FIG. 7 depicts an embodiment of a laser system having two diode temperature detectors (DTD) and a lock-in amplifier with pilot tone used for determining a lasing wavelength for the laser.

Referring next to FIG. 7, an embodiment of third tunable laser 100-3 using pilot tone to center a longitudinal mode with a pair of peaks 504 is shown. Similar to FIG. 1, the third tunable laser 100-3 comprises a first BSG 104-1, a second BSG 104-2, and a phase adjuster 108. The first BSG 104-1 is tuned using a first heating element 116-1; the second BSG 104-2 is tuned using a second heating element 116-2; and the phase adjuster 108 is tuned using a third heating element 116-3. A first diode temperature detector 120-1 is used to monitor a temperature of the first BSG 104-1. A second diode temperature detector 120-2 is used to monitor a temperature of the second BSG 104-2.

Also shown in FIG. 7 is a directional coupler 110 outputting a portion of light from the third tunable laser 100-3 to a Monitor Photo Diode (MPD) 708. In some embodiments, the MPD 708 is grown on a common substrate with the first BSG 104-1 and the second BSG 104-2. Also shown is a lock-in amplifier 712. In some embodiments, the lock-in amplifier 712 is digital.

The third tunable laser 100-3 is operated by thermally tuning the first BSG 104-1 and the second BSG 104-2 to align a pair of peaks as discussed in steps 404 and 408 of FIG. 4. In some embodiments, an initial heat bias is added to the first heating element 116-1, the second heating element 116-2, and/or the third heating element 116-3. To align a longitudinal mode of the third tunable laser 100-3 with the aligned pair of peaks 504, a pilot tone is applied to the third heating element 116-3 of the phase adjuster 108. In some embodiments, the pilot tone is a 1-10 kHz square wave generated by a microprocessor 716. The pilot tone dithers the temperature of the phase adjuster 108, which in turn dithers the longitudinal mode of the third tunable laser 100-3. The MPD 708 monitors a power output of the third tunable laser 100-3 from the directional coupler 110. A signal from the MPD 708 is fed back to the lock-in amplifier 712 to complete a lock-in loop. Using feedback from the MPD 708, a longitudinal mode can be aligned to a center of the aligned pair of peaks 504.

In some embodiments, using the phase adjuster 108 to modify longitudinal modes of the third tunable laser 100-3 with pilot tone is referred to as main cavity (MC) control. Thus the third tunable laser 100-3 can be operated at a particular frequency (e.g., an ITU channel) with the main cavity control on ($MC_{on}$), the first heating element 116-1 of the first BSG 104-1 locked to a temperature using the first DTD 120-1, and the second heating element 116-2 of the second BSG 104-2 locked to a temperature using the second DTD 120-2:

$$(DTD_1, DTD_2, MC_{ON}) \Rightarrow ITU_N.$$

Thus, unlike the first tunable laser 100-1 in FIG. 1, the third tunable laser 100-3 in FIG. 7 can operate at a particular ITU channel without the third DTD 120-3. The third tunable laser 100-3 in FIG. 7 tunes to temperatures using one or more PID loops to lock to predetermined temperatures of the first DTD 120-1 and the second DTD 120-2; and the third tunable laser 100-3 uses the pilot tone to tune the longitudinal mode. Thus operating the third tunable laser 100-3 at different ITU channels is determined by two temperatures instead of three. In some embodiments, the third tunable laser 100-3 in FIG. 7 also comprises the third DTD 120-3 for the phase adjuster 108. For example, the pilot tone is used in calibrating the third tunable laser 100-3, but not in normal operation after calibration. Though not meant to be limiting, in some embodiments, using pilot tone can speed up calibration of the third tunable laser 100-3. Thus, after the pilot tone is used to center the longitudinal mode of the third tunable laser 100-3 with the first BSG 104-1 and the BSG 104-2 at a particular ITU channel, temperatures of the first DTD 120-1, the second DTD 120-2, and the third DTD 120-3 are recorded for later operating the tunable laser at the particular ITU channel.

Figure 8:
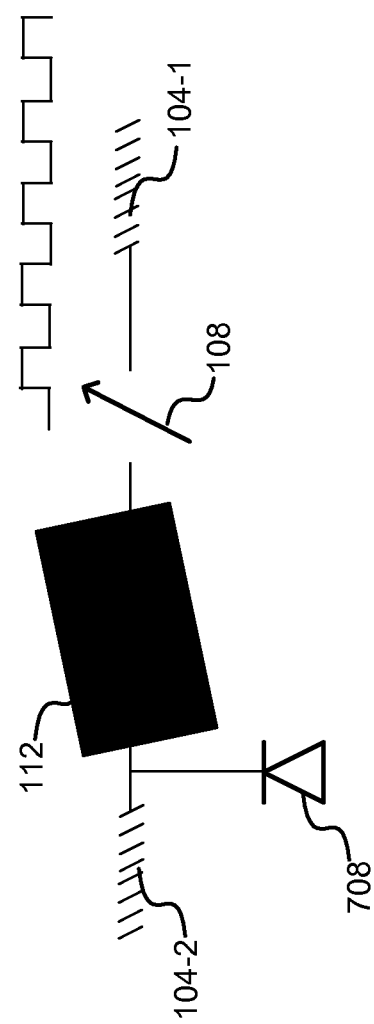
FIG. 8 depicts a schematic of an embodiment of a laser system having a square wave pilot tone applied to a main cavity adjuster.

Referring next to FIG. 8, a schematic of an embodiment of a fourth tunable laser 100-4 having a square wave pilot tone applied to a main-cavity adjuster is shown. An initial DC heat bias is added the phase adjuster 108. A pilot tone is applied to the phase adjuster 108 so that temperature of a heating element 116 of the phase adjuster 108 is dithered. A signal from a monitor photo detector (MPD) 708 is used as feedback to close a lock-in amplifier loop. In this embodiment, the pilot tone is a square wave.

Figure 9B:
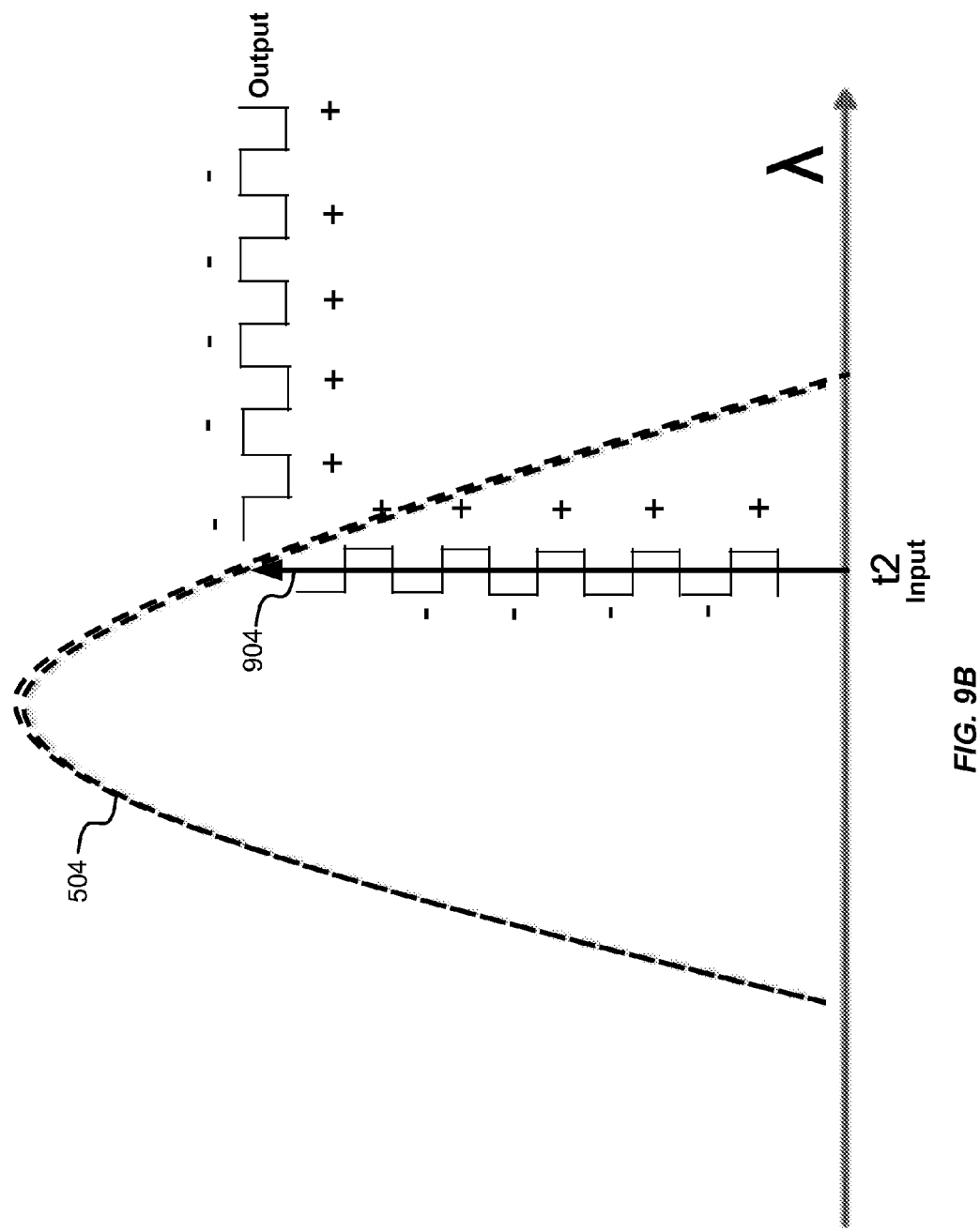

Referring next to FIGS. 9A, 9B, and 9C, sketches of embodiments of an aligned pair of peaks 504 with a pilot tone applied to a longitudinal mode 904 are shown. In FIG. 9A, an aligned pair of peaks is shown with a longitudinal mode 904 at t1. The longitudinal mode 904 at t1 is to the left of center of the aligned pair of peaks 504. A square-wave input is superimposed on the longitudinal mode 904. The square-wave input represents a pilot tone applied to the phase adjuster 108. When current is increased to the heating element 116 of the phase adjuster 108 (e.g., the third heating element 116-3), the heating element 116 of the phase adjuster 108 increases temperature (e.g., through resistance), and the longitudinal mode 904 is red-shifted (i.e., has a longer wavelength; moves to the right on the figure). Conversely, when current to the heating element 116 of the phase adjuster 108 is decreased, the temperature of the heating element 116 of the phase adjuster 108 decreases, and the longitudinal mode 904 is blue-shifted (i.e., has shorter wavelength; moves to the left on the figure).

An output, shown as a square wave, is also shown. The output represents a power output detected by the MPD 708. A plus sign is shown on the output corresponding to an increase of current to the heating element 116 of the phase adjuster 108. A minus sign is shown below the output corresponding to a decrease of current to the heating element 116 of the phase adjuster 108. In FIG. 9A, plus signs are placed near maximum values of the output square wave, and minus signs are placed near minimum values of the output square wave. The input and output of FIG. 9A are considered in phase because when current is increased to the heating element 116 of the phase adjuster 108, there is a corresponding increase in output power to the MPD 708 since there is higher total reflectance (i.e., less loss for in the laser resonator) when the longitudinal mode 904 is red shifted. A summation of the value of the output is positive: $\Sigma > 0$, since values of the MPD 708 corresponding to increased current are a positive number and values of the MPD 708 corresponding to decreased current are a negative number (values of the MPD 708 corresponding to decreased current are multiplied by −1).

In FIG. 9B, an aligned pair of peaks 504 is shown with a longitudinal mode 904 at t2. The longitudinal mode 904 at t2 is to the right of center of the aligned pair of peaks 504. A square-wave input is superimposed on the longitudinal mode 904 representing a pilot tone applied to the phase adjuster 108. When current is increased to the heating element 116 of the phase adjuster 108, the heating element 116 of the phase adjuster 108 increases temperature, and the longitudinal mode 904 is red-shifted. Conversely, when current to the heating element 116 of the phase adjuster 108 is decreased, the temperature of the heating element 116 of the phase adjuster 108 decreases, and the longitudinal mode 904 is blue-shifted.

An output, shown as a square wave, is also shown. The output represents a power output detected by the MPD 708. A plus sign is shown on the output when there is an increase of current to the heating element 116 of the phase adjuster 108. A minus sign is shown on the output where when there is a decrease of current to the heating element 116 of the phase adjuster 108. In FIG. 9B, plus signs are placed near minimum values of the square wave, and minus signs are placed near the maximum values of the square wave. The input and output of FIG. 9B are considered out of phase (or pi phase shifted) because an increase of current to the heating element 116 of the phase adjuster 108 causes a decrease in optical power received at the MPD. The pi phase shift occurs when a longitudinal mode 904 is to the right of center of an aligned pair of peaks 504 because while the longitudinal mode 904 is red shifted (e.g., increasing current to the phase adjuster 108) there is less reflectance/higher loss and the output power at the MPD 708 decreases. A summation of the value of the output is negative: $\Sigma < 0$, since values of the MPD 708 corresponding to increased current are positive and values of the MPD 708 corresponding to decreased current are negative (values of the MPD 708 corresponding to decreased current are multiplied by −1).

In FIG. 9C, an aligned pair of peaks 504 is shown with a longitudinal mode 904 at t3. The longitudinal mode 904 at t3 is at the center of the aligned pair of peaks 504. A square-wave input is superimposed on the longitudinal mode 904 representing a pilot tone applied to the phase adjuster 108. While current is increased to the heating element 116 of the phase adjuster 108, the heating element 116 of the phase adjuster 108 increases temperature, and the longitudinal mode 904 is red-shifted. Conversely, while current to the heating element 116 of the phase adjuster 108 is decreased, the temperature of the heating element 116 of the phase adjuster 108 decreases, and the longitudinal mode 904 is blue-shifted.

An output sum, shown as a flat line, is also shown. The output sum represents a summation of power output detected by the MPD 708. The output sum is basically flat because the longitudinal mode 904 while red shifted has about the same reflectance as the longitudinal mode 904 while blue shifted. Thus $\Sigma \sim 0$, since values of the MPD 708 corresponding to increased current are positive and values of the MPD 708 corresponding to decreased current are negative (values of the MPD 708 corresponding to decreased current are multiplied by −1).

Figure 10A:
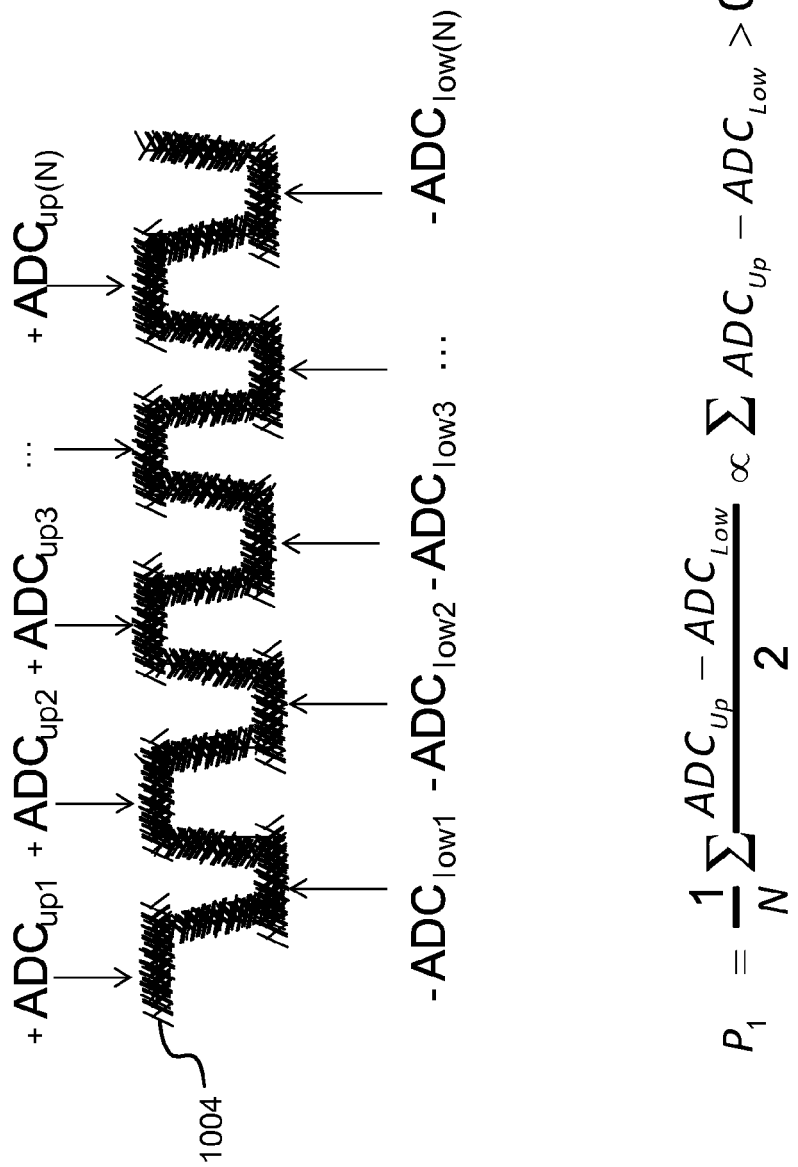
FIGS. 10A and 10BB depict drawings of example outputs from a monitor photo diode (MPD).
Figure 10B:
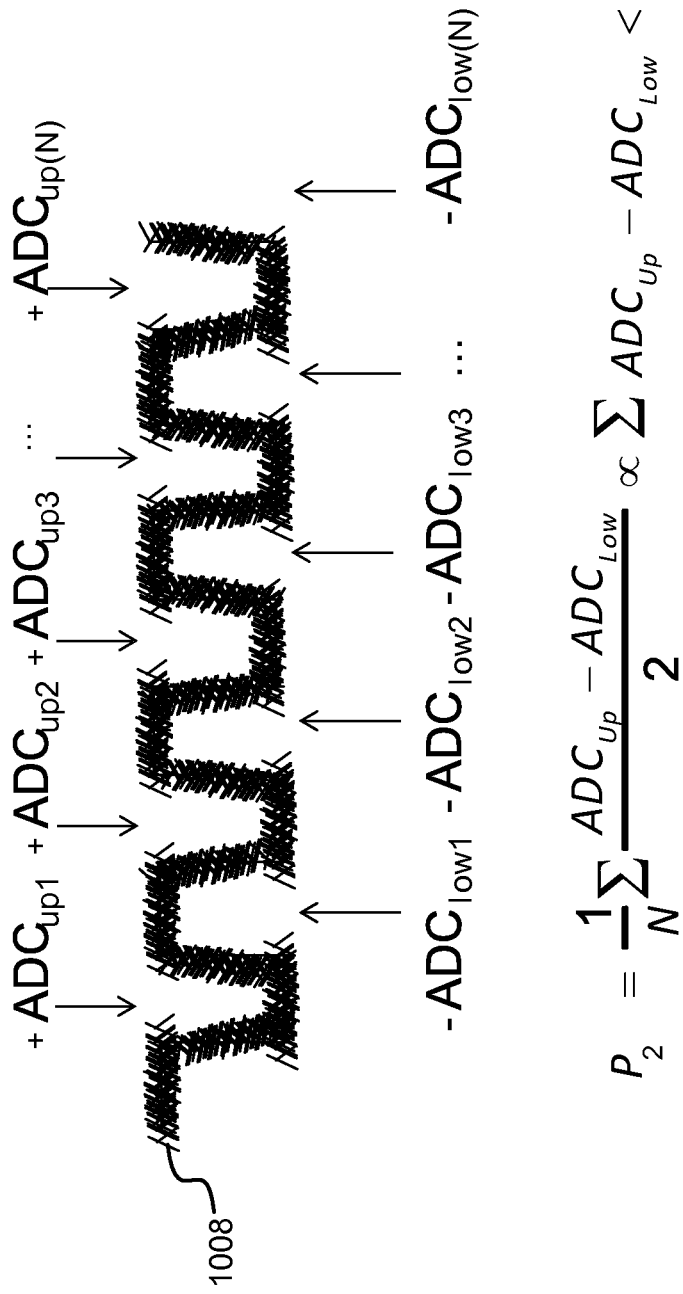

Referring next to FIGS. 10A and 10B, example MPD 708 outputs are shown. In FIG. 10A, an example MPD 708 output 1004 for a longitudinal mode 904 to the left of the center of an aligned pair of peaks 504 is shown (e.g., for a longitudinal mode 904 at t1 in FIG. 9A). FIG. 10A is an example where the summation of the MPD 708 output 1004 is greater than zero, $\Sigma>0$, where $P_1$ is the power of the MPD 708 for the longitudinal mode to the left of the center of the aligned pair of peaks 504. The MPD 708 acquires a plurality individual readings. An individual reading is assigned a positive value if the individual reading corresponds to an increase of current to the phase adjuster 108 (e.g., current to the third heating element 116-3). An individual reading is assigned a negative value if the individual reading corresponds to a decrease of current to the phase adjuster 108. Thus in FIG. 10A, individual readings at a maximum of the square wave are assigned positive values and individual readings at a minimum of the square wave are assigned negative values. The summation of the individual readings (e.g., M individual readings over a single waveform period for N waveform periods) returns a positive number because individual readings with higher magnitude are assigned positive values. Exemplary values of M and N are: M=1, 2, 4, 8, 16, 20, 24, 32; N=1, 2, 3, 4, 5, 10. By way of example, if M=8 and N=3, there would be a total of 24 individual readings; eight readings per period; twelve readings at the maximum of a square wave and twelve readings at the minimum of the square wave over three periods.

Current to the phase adjuster 108 comprises a DC bias and the pilot tone. Main cavity heat (MC_H) is proportional to the DC bias. If the summation of the individual readings is positive, then a positive shift is added to the DC bias. For example, in the equation below, if the summation of the individual readings is greater than zero (e.g., greater than a threshold), then a new DC bias $<MC\_H_{t+1}>$(an average of the main cavity heat) is determined by adding a shift to the bias temperature of the main cavity ($<MC\_H_t>$); an average of the main cavity heat during a time the individual readings are taken:

If $\Sigma>0 \Rightarrow <MC\_H_{t+1}>=<MC\_H_t>+$Shift

After the shift to the bias temperature is applied, another loop cycle is started. A loop cycle comprises taking a number of individual readings from the optical sensor (e.g., MPD 708) and determining to add a shift to the bias temperature, subtract a shift to the bias temperature, or to neither add nor subtract a shift to the bias temperature.

In some embodiments, if a shift to the bias temperature is small then a large number of loop cycles are performed to align the longitudinal mode 904 of the tunable laser 100 with the aligned pair of peaks 504 (i.e., takes longer to align). Conversely, if the shift to the bias temperature is large, then accuracy of aligning is reduced. Though not meant to be limiting, Applicant has found that a shift to the bias temperature that corresponds to a 20-100 MHz shift in frequency of the tunable laser 100 to be a reasonable compromise between alignment speed and alignment accuracy for lasing wavelengths around 1500 nm.

In FIG. 10B, an example MPD 708 output 1008 for a longitudinal mode 904 to the right of the center of an aligned pair of peaks 504 is shown (e.g., for a longitudinal mode 904 at t2 in FIG. 9B). FIG. 10A is an example where the summation of the MPD 708 output 1008 is less than zero, <0, where $P_2$ is the power of the MPD 708 for the longitudinal mode to the right of the center of the aligned pair of peaks 504. The MPD 708 acquires a plurality of individual readings (similar as explained in FIG. 10A). An individual reading is assigned a positive value if the individual reading corresponds to an increase of current to the phase adjuster 108 (e.g., current to the third heating element 116-3). An individual reading is assigned a negative value if the individual reading corresponds to a decreased current to the phase adjuster. Thus, in FIG. 10B, maximum values of the square wave are assigned negative values and minimum values of the square wave are assigned positive values because the example MPD 708 output 1008 is out of phase with the input as described in FIG. 9B. The summation of the individual readings returns a negative number. If the summation of the individual readings is negative, then a negative shift is added to the DC bias.

If $\Sigma<0 \Rightarrow <MC\_H_{t+1}>=<MC\_H_t>-$Shift

Thus a plurality of loop cycles are performed to adjust the longitudinal mode 904 of the laser cavity to the aligned pair of peaks. In some embodiments, using pilot tone helps calibrate the tunable laser 100. For example, step 404 in FIG. 4 is performed to align a pair of peaks. A pilot tone with a lock-in amplifier 712 is then used to align a longitudinal mode 904 within the aligned pair of peaks 504. Using a wavelength meter, the aligned pair of peaks are adjusted to a desired frequency. The step of using the wavelength meter to align the aligned pair of peaks 504 to the desired frequency is simplified because a longitudinal mode 904 of the tunable laser 100 remains centered with the aligned pair of peaks 504 and it is easier to identify when the center of the aligned pair of peaks 504 reaches the desired frequency.

The specific details of particular embodiments may be combined in any suitable manner without departing from the spirit and scope of embodiments of the invention. However, other embodiments of the invention may be directed to specific embodiments relating to each individual aspect, or specific combinations of these individual aspects.

The above description of exemplary embodiments of the invention has been presented for the purposes of illustration and description. It is not intended to be exhaustive or to limit the invention to the precise form described, and many modifications and variations are possible in light of the teaching above. For example, many processes can be performed by analog and/or digital components embedded in a chip (such as one or more of the PID loops being performed using one or more embedded μProcessors) or external to the chip. The embodiments were chosen and described in order to explain the principles of the invention and its practical applications to thereby enable others skilled in the art to utilize the invention in various embodiments and with various modifications as are suited to the particular use contemplated.

Also, it is noted that the embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in the figure. A process may correspond to a method, a function, a procedure, a subroutine, a subprogram, etc.

A recitation of "a", "an", or "the" is intended to mean "one or more" unless specifically indicated to the contrary.

All patents, patent applications, publications, and descriptions mentioned here are incorporated by reference in their entirety for all purposes. None is admitted to be prior art.

What is claimed is:

1. A tunable laser system comprising:
a first wavelength selective element characterized by a first reflectance spectrum, wherein:
the first is a function of temperature of a first heating element; and
the first wavelength selective element is formed on a substrate;
a second wavelength selective element characterized by a second reflectance spectrum, wherein:
the second wavelength selective element is formed on the substrate;
the second reflectance spectrum is a function of temperature of a second heating element; and
the first wavelength selective element and the second wavelength selective element form an optical resonator;
a phase adjuster for modifying an index of refraction of a material to alter an optical path length of the optical resonator by changing a temperature of the material using a third heating element, wherein the index of refraction of the material is a function of temperature;
a photodiode configured to monitor a power output of the tunable laser system, wherein the photodiode is formed on the substrate;
electronics configured to:
apply a bias to the phase adjuster;
apply a time-varying signal with the bias to the phase adjuster;
a gain medium between the first wavelength selective element and the second wavelength selective element;
a first temperature sensor configured to determine changes in temperature of the first heating element; and
a second temperature sensor configured to determine changes in temperature of the second heating element, wherein operating the tunable laser system at different lasing frequencies is based on using predetermined values for the first temperature sensor, predetermined values for the second temperature sensor, and an electrical signal from the photodiode detecting the time-varying signal to modify the bias.

2. The tunable laser system of claim 1, wherein the time-varying signal is a square wave.

3. The tunable laser system of claim 1, wherein the first wavelength selective element and the second wavelength selective element each comprise a binary super grating.

4. The tunable laser system of claim 1, wherein the first wavelength selective element and the second wavelength selective element are made of silicon and the gain medium comprises III-V material.

5. The tunable laser system of claim 1, wherein:
the first wavelength selective element and the second wavelength selective element are formed on a silicon-on-insulator (SOI) wafer; and
the gain medium is disposed in a pit of the SOI wafer.

6. The tunable laser system of claim 1, wherein the time-varying signal repeats periodically equal to 1 kHz, 10 kHz, or a value between 1 kHz and 10 kHz.

7. The tunable laser system of claim 1 further comprising:
a first controller for locking the first heating element to a first predetermined value using input from the first temperature sensor, wherein the first controller is a proportional integral derivative (PID) controller;
a second controller for locking the second heating element to a second predetermined value using input from the second temperature sensor, wherein the second controller is a PID controller; and
a third controller for locking the third heating element to a third value, wherein:
the third value corresponds to aligning a longitudinal mode of the tunable laser system with a reflectance peak;
the reflectance peak is formed by an overlap of the first reflectance spectrum with the second reflectance spectrum;
the third controller locks the third heating element using feedback from the photodiode detecting the time-varying signal; and
the first predetermined value and the second predetermined value determine a lasing frequency of the tunable laser system.

8. The tunable laser system of claim 1 further comprising a directional coupler disposed between the first wavelength selective element and the second wavelength selective element, wherein:
the directional coupler provides an optical output for the tunable laser system;
the directional coupler comprises a shoulder and a ridge; and
the shoulder tapers in a first portion of the directional coupler;
the ridge tapers in a second portion of the directional coupler; and
the shoulder does not taper in the second portion of the directional coupler.

9. A method for calibrating a laser, the method comprising:
thermally tuning a first wavelength selective element formed on a substrate and a second wavelength selective element formed on the substrate, wherein:
the first wavelength selective element has a first plurality of reflectance peaks;
the second wavelength selective element has a second plurality of reflectance peaks; and
thermally tuning the first wavelength selective element and the second wavelength selective element includes aligning a reflectance peak of the first plurality of reflectance peaks to, at least partially, overlap a reflectance peak of the second plurality of reflectance peaks to form an aligned pair of peaks, wherein the aligned pair of peaks has a reflectance at a first frequency;

thermally tuning a phase section of the laser to align a longitudinal mode of the laser within the aligned pair of peaks, wherein thermally tuning the phase section comprises:
   applying a bias to the phase section;
   applying a time-varying signal to the phase section while applying the bias;
   detecting the time-varying signal using a photodiode, wherein the photodiode is formed on the substrate;
   adjusting the bias based on detecting the time-varying signal; and
recording a first value, wherein:
   the first value is from a first temperature sensor;
   the first temperature sensor measures values corresponding to a temperature of a first heating element; and
   the first heating element is used to change temperature of the first wavelength selective element;
recording a second value, wherein:
   the second value is from a second temperature sensor;
   the second temperature sensor measures values corresponding to a second heating element; and
   the second heating element is used to change temperature of the second wavelength selective element;
recording a third value, wherein:
   the third value is from a third temperature sensor;
   the third temperature sensor measures values corresponding to a temperature of a third heating element;
   the third heating element is used to change temperature of the phase section; and
   the first value, the second value, and the third value determine a first lasing frequency of the laser;
determining a fourth value and a fifth value to operate the laser at a second lasing frequency, wherein:
   determining the fourth value is based on an extrapolation using the first value; and
   determining the fifth value is based on an extrapolation using the second value;
adjusting the first wavelength selective element using the fourth value; and
adjusting the second wavelength selective element using the fifth value.

10. The method for calibrating the laser of claim 9, wherein:
thermally tuning the first wavelength selective element and the second wavelength selective element includes using a wavelength meter; and
the wavelength meter is different from the photodiode.

11. The method for calibrating the laser of claim 9, the method further comprising aligning the aligned pair of peaks with an ITU (International Telecommunications Union) channel.

12. The method for calibrating the laser of claim 9, wherein:
the laser uses a semiconductor material for a gain medium;
a first injection current is used for the gain medium during the tuning of the phase section of the laser to align the longitudinal mode; and
a second injection current, different from the first injection current, is used for the gain medium for a second tuning of the phase section of the laser to align the longitudinal mode.

13. The method for calibrating the laser of claim 9, wherein when the aligned pair of peaks is formed, other peaks of the first plurality of reflectance peaks do not substantially overlap with other peaks of the second plurality of reflectance peaks.

14. The method for calibrating the laser of claim 9, wherein the time-varying signal is a square wave.

15. The method for calibrating the laser of claim 9, wherein the time-varying signal repeats periodically equal to 1 kHz, 10 kHz, or a value between 1 kHz and 10 kHz.

16. A method for calibrating and operating a tunable laser, the method comprising:
tuning a first wavelength selective element and a second wavelength selective element, wherein:
   the first wavelength selective element has a first plurality of reflectance peaks;
   the second wavelength selective element has a second plurality of reflectance peaks; and
   tuning the first wavelength selective element and the second wavelength selective element includes aligning a reflectance peak of the first plurality of reflectance peaks to, at least partially, overlap a reflectance peak of the second plurality of reflectance peaks to form an aligned pair of peaks, wherein the aligned pair of peaks has a reflectance at a given frequency;
identifying a first value, wherein:
   the first value corresponds to a first temperature of a first heating element; and
   the first heating element is used to change temperature of the first wavelength selective element;
identifying a second value, wherein:
   the second value corresponds to a first temperature of a second heating element;
   the second heating element is used to change temperature of the second wavelength selective element; and
   the first value and the second value determine, at least partially, a first lasing frequency of the tunable laser;
analytically predicting, using the first value and the second value, a third value and a fourth value to operate the tunable laser at a second lasing frequency, wherein:
   the third value corresponds to a second temperature of the first heating element; and
   the fourth value corresponds to a second temperature of the second heating element; and
operating the tunable laser, after analytically predicting the third value and the fourth value, at the second lasing frequency using:
   the third value,
   the fourth value,
   a time-varying signal with a bias applied to a third heating element used to change temperature of a phase adjuster,
   a photodiode used to detect the time-varying signal, and
   feedback from detecting the time-varying signal to change the bias.

17. The method of claim 16, further comprising adjusting the first heating element using a control loop feedback mechanism.

18. The method of claim 17, wherein the time-varying signal is a 1-10 kHz square wave.

19. The method of claim 16, wherein the first value is a temperature, current, or voltage.

20. The method of claim 16, wherein:
the tunable laser is a semiconductor laser on a substrate; and the first heating element, the second heating element, the third heating element, and the photodiode are integrated on the substrate using CMOS processing techniques.

* * * * *